United States Patent [19]

Fryd et al.

[11] Patent Number: 4,956,252

[45] Date of Patent: Sep. 11, 1990

[54] AQUEOUS PROCESSIBLE PHOTOSENSITIVE COMPOSITIONS CONTAINING CORE SHELL MICROGELS

[75] Inventors: Michael Fryd, Moorestown, N.J.; Ernst Leberzammer, Glen Mills, Pa.; S. Andries R. Sebastian, East Windsor, N.J.

[73] Assignee: E. I. duPont de Nemours and Company, Wilmington, Del.

[21] Appl. No.: 238,104

[22] Filed: Aug. 30, 1988

[51] Int. Cl.$^5$ .......................... G03C 1/68; G03C 5/16
[52] U.S. Cl. .................... 430/138; 430/281; 430/910; 430/271; 430/325; 522/121; 522/110; 522/114
[58] Field of Search ............... 430/138, 281, 910, 271, 430/325; 522/121, 110, 114

[56] References Cited

U.S. PATENT DOCUMENTS

| | | | |
|---|---|---|---|
| 3,895,082 | 7/1975 | Hochberg | 204/159.1 |
| 3,929,693 | 12/1975 | Hochberg | 260/17 R |
| 4,272,608 | 6/1981 | Proskow | 430/288 |
| 4,323,636 | 4/1982 | Chen | 430/271 |
| 4,414,278 | 11/1983 | Cohen et al. | 428/40.2 |
| 4,518,472 | 5/1985 | Kishida et al. | 204/159.15 |
| 4,601,970 | 7/1986 | Cohen et al. | 430/258 |
| 4,726,877 | 2/1988 | Fryd et al. | 156/630 |
| 4,762,892 | 8/1988 | Koch et al. | 430/281 |
| 4,777,115 | 10/1988 | Koch et al. | 525/279 |

FOREIGN PATENT DOCUMENTS

| | | |
|---|---|---|
| 86/65535 | 5/1987 | Australia . |
| 614181 | 2/1981 | Canada . |
| 212542 | 3/1987 | European Pat. Off. . |
| 280979 | 9/1988 | European Pat. Off. . |
| 3543646 | 6/1987 | Fed. Rep. of Germany . |
| 3601802 | 7/1987 | Fed. Rep. of Germany . |
| 52-11630 | 9/1977 | Japan . |
| 976051 | 8/1964 | United Kingdom . |

*Primary Examiner*—Paul R. Michl
*Assistant Examiner*—Cynthia Hamilton

[57] ABSTRACT

The present invention concerns an aqueous processible solid photosensitive composition for making relief plates comprising (a) an addition photopolymerizable ethylenically unsaturated monomer;

(b) a photoinitiator or photoinitiating system activated by actinic light; and (c) a core shell microgel binder; wherein the core shell microgel binder has two domains, a core having less than 10% crosslinking and an aqueous processible non-crosslinked outer shell consisting of an acid-modified copolymer, and further wherein the monomer partitions in the shell of the microgel. The invention also concerns a photosensitive element containing this composition.

11 Claims, 13 Drawing Sheets

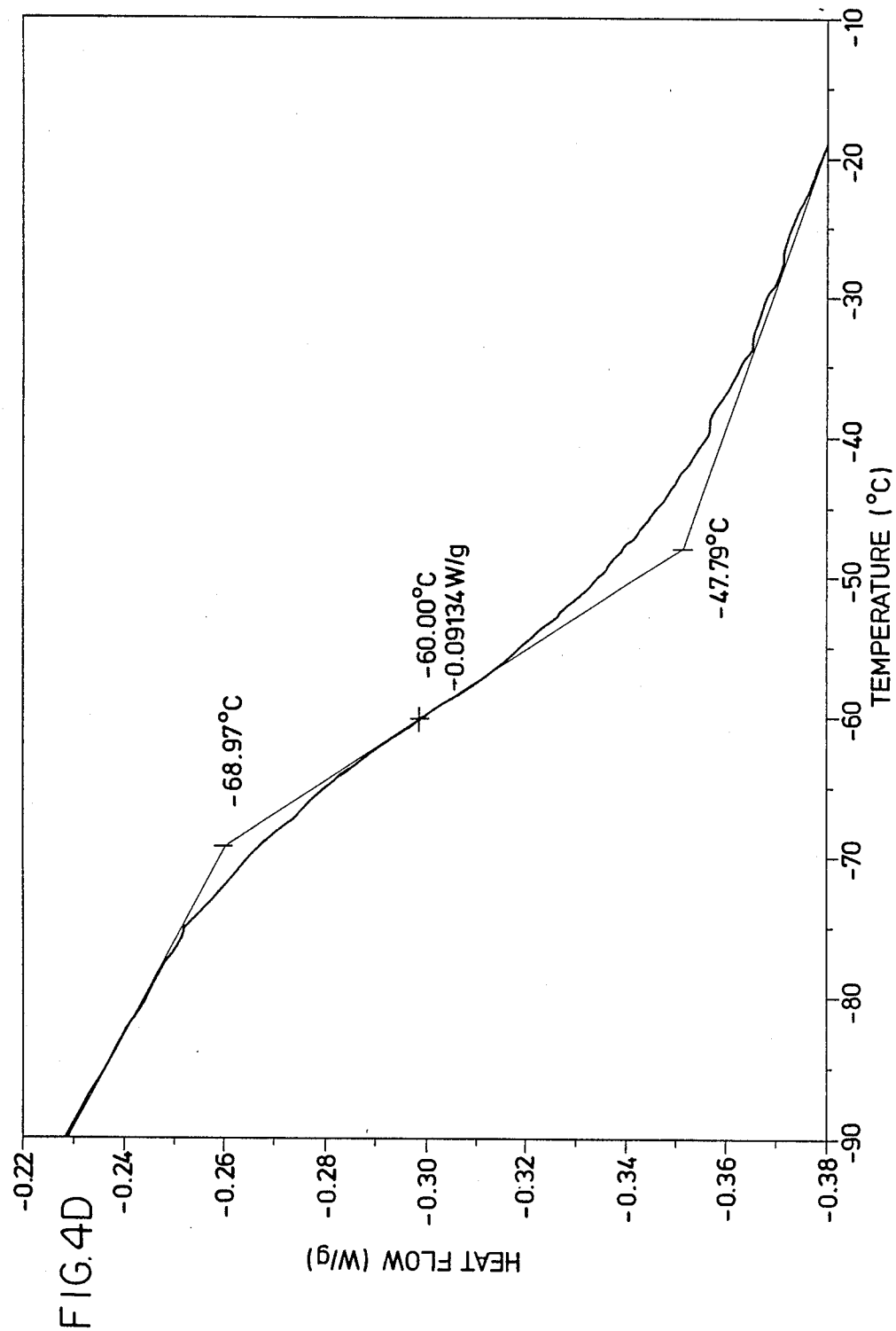

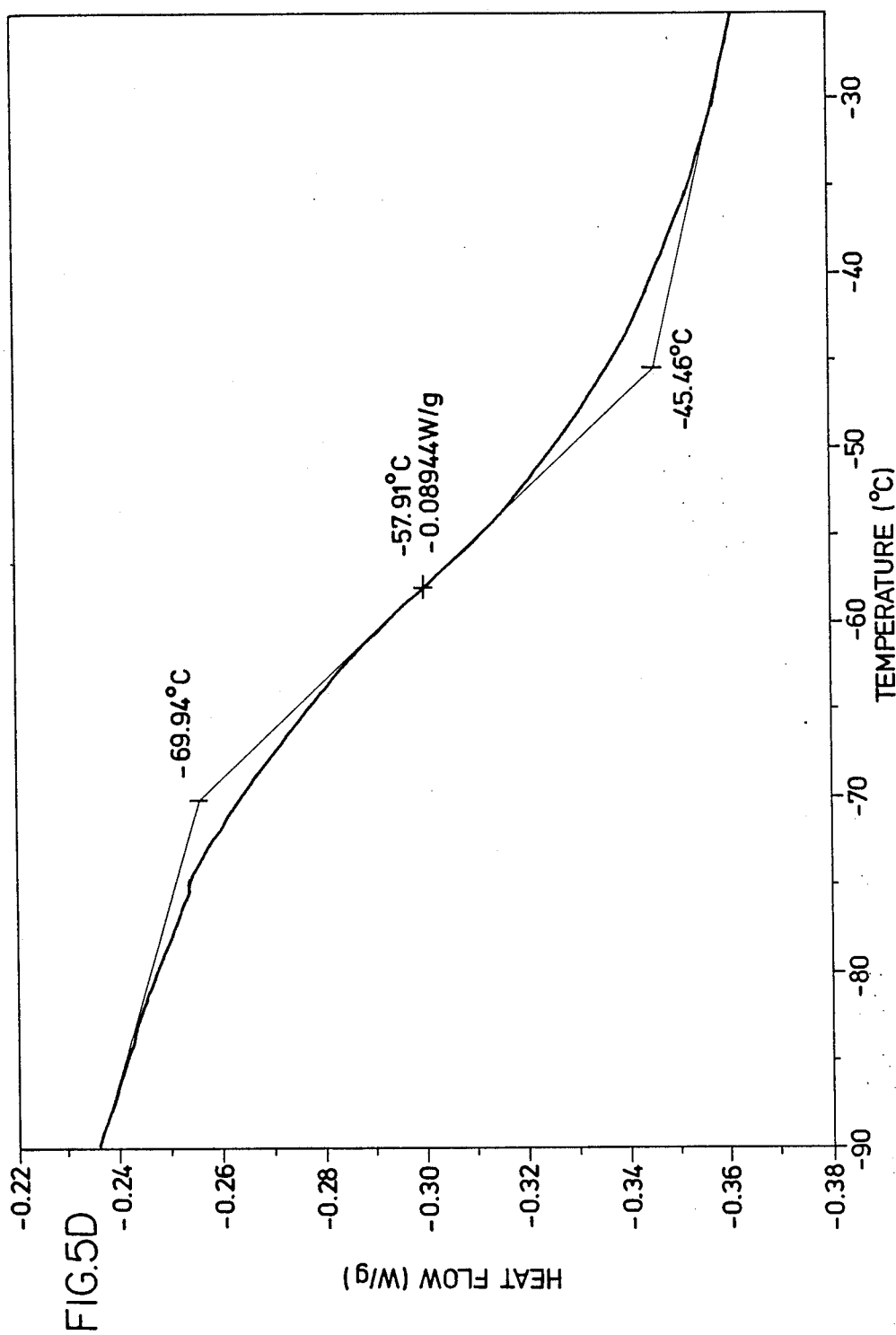

AQUEOUS PROCESSIBLE PHOTOSENSITIVE COMPOSITIONS CONTAINING CORE SHELL MICROGELS

FIELD OF THE INVENTION

This invention relates to solid photosensitive compositions and, more particularly, to aqueous processible photosensitive compositions having core shell microgels.

BACKGROUND OF THE INVENTION

Photosensitive compositions useful in preparing flexographic printing plates are well known in the art. These compositions generally comprise (1) an addition polymerizable, non-gaseous, ethylenically unsaturated monomer, (2) a photoinitiator or system activated by actinic radiation and (3) a thermoplastic, elastomeric polymeric binder comprising polymerized conjugated diene monomers. Flexographic printing elements can be made from these photosensitive compositions by solvent casting or by extruding, calendering or pressing at an elevated temperature of the photosensitive composition into the form of a layer or self-supporting sheet on a suitable casting wheel, belt or platen. The sheet can be permanently affixed to a suitable permanent substrate and, usually, a removable cover sheet is placed on top to protect the photosensitive composition.

Photopolymerizable elements and processes for their use in preparing relief printing plates are well known in the art: U.S. Pat. Nos. 2,760,863, 3,556,791, 3,798,035, 3,825,430 and 3,951,657.

Extrusion is the preferred method for making photosensitive elements using the photosensitive composition of the instant invention. Thus, it is important that the photosensitive composition of this invention extrudes well. It is equally important that this composition be developable in a semi-aqueous or aqueous systems and this composition should have storage stability.

Cold flow deleteriously affects storage stability in that an excessive amount of cold flow results in the material becoming unacceptable, i.e., edge fusion occurs which prevents unstacking of photopolymerizable plates without damaging the continuity of the photopolymerizable composition.

Generally, storability with minimization of cold flow is imparted by proper selection and formulation of the components of the photopolymerizable material.

Use of an additive component to change physical properties in a composition is well known. One example is using beads as filler in an organic polymer composition which may be optionally polymerizable as disclosed in U.S. Pat. No. 4,414,278. The polymeric beads are discrete, substantially nonswellable and crosslinked with an average diameter of 0.7 to 20 micrometers.

In contrast to the use of highly crosslinked, nonswellable beads in a compositon are swellable microgels. Microgel is a term originated in the paint industry and it includes crosslinked spherical polymer molecules of high molecular weight such as of the order of $10^9$ to $10^{10}$ with a particle size of 0.05 to 1 micron in diameter prepared by emulsion polymerization. The term microgel conventionally refers to a particle having some degree of crosslinking throughout the entire particle. Crosslinking renders these microgels insoluble but capable of swelling in strong solvent without destroying the crosslinked structure. The preparation and use of such microgels is disclosed in British Patent No. 967,051 and U.S. Pat. No. 3,895,082.

The term microgel as used herein is not used in its conventional sense, rather, the term refers to a particle having two domains—a crosslinked core and an aqueous processible non-crosslinked shell. The core should have less than 10% crosslinking and the shell consists of an acid-modified copolymer.

U.S. Pat. No. 4,726,877 teaches the use of microgels to replace all or part of the binder of photosensitive compositions to improve resistance to cold flow. The microgels discussed have some degree of crosslinking throughout the entire particle. Even the core shell microgels which are mentioned have a crosslinked shell as is evidenced by the presence of the crosslinker, butanediol diacrylate, in the shell. See, core shell microgels O and P discussed in Table 1 in column 7. There is no teaching or suggestion of using a core shell microgel which has less than 10% crosslinking in the core and an aqueous procesible shell consisting of an acid-modified copolymer. Nor is there any teaching of using an ethylenically unsaturated monomer which partitions in the shell.

Japanese Patent Application No. 52/116,301 discloses the use of a component described as microgel in a non-aqueous processible photosensitive composition use for molding plates. The microgel appears to be a core shell microgel which is described as a rubber type substance obtained by a graft polymerization of a vinyl monomer with a so-called rubber type base material having particle diameter of 0.01 to 10 microns. The microgel materials used are referred to as elastomers which by definition have glass transition temperatures below room temperature. It is believed that the microgel is incorporated to toughen the rubber type material. The principles underlying rubber toughening are discussed by Seymour Newman and C. B. Bucknall in "Polymer Blends", D. R. Paul, ed., New York, 1978, volume 2, pp. 63–127. The presence of small rubber particles dispersed in a matrix of a more brittle polymer promotes crazing in the matrix polymer on impact, delayilng the onset of crack formation. The dispersed phase must be incompatible with the matrix polymer to remain as a discrete phase, and the temperature of use must be above the rubber's glass transition temperature in order for it to function as a toughening agent. These two requirements are fulfilled by the microgels described in Japanese Patent Application No. 52/116,301.

A delustering coating compositon which contains fine particles is disclosed in U.S. Pat. No. 4,518,472. The composition is applied to a molded article to provide high abrasion resistance or scratch resistance. Such composition for coating is a liquid which differs from the solid films of the present invention.

U.S. Pat. No. 4,272,608 discloses photosensitive compositions comprising high molecular weight butadiene/acrylonitrile copolymer containing carboxyl groups cross-linked via selected metal ions. The butadiene/acrylonitrile copolymer components are compatible with, and can be soluble in, the ethylenically unsaturated compound in the proportions used. The copolymer components, which constitute the binder, and the ethylenically unsaturated compound are dispersed evenly within one another. Microgels are not used.

Compatibility is also mentioned in U.S. Pat. No. 4,323,636 which discloses that the thermoplastic-elastomeric block copolymer component should be compatible with and, preferably soluble in, the ethylenic component when used in a ratio range of 99:1 to about 1:1. It is mentioned that compatibility can be achieved when the ethylenic component is soluble in either of the component blocks of the block copolymer. Microgels are not used.

SUMMARY OF THE INVENTION

The present invention concerns an aqueous processible solid photosensitive composition for making relief plates comprising (a) an addition photopolymerizable ethylenically unsaturated monomer;

(b) a photoinitiator or photoinitiating system activated by actinic light; and (c) a core shell microgel binder; wherein the core shell microgel binder has two domains, a core having less than 10% crosslinking and an aqueous processible non-crosslinked outer shell consisting of an acid-modified copolymer, and further wherein the monomer partitions in the shell of the microgel. The invention also concerns a photosensitive element containing this composition.

BRIEF DESCRIPTION OF FIGURES

FIGS. 4A-4E show partitioning of the monomer, 1,6-hexanediol diacrylate (HMDA), in the core of the core shell microgel C as determined by differential scanning calorimetry.

FIGS. 5A-5D show partitioning of the momomer, trimethylolpropane ethoxy triacrylate (TMPEOTA), in the shell of core shell microgel C as determined indirectly by differential scanning calorimetry.

FIG. 6 shows a plot of log (viscosity) versus log (shear rate) for microgel C and comparative microgels 1D and 1E.

FIG. 7 shows a plot of log (viscosity) versus log (shear rate) for microgel C, microgel A, and comparative microgels 1F and 1G.

DETAILED DESCRIPTION OF THE INVENTION

Figure 1:
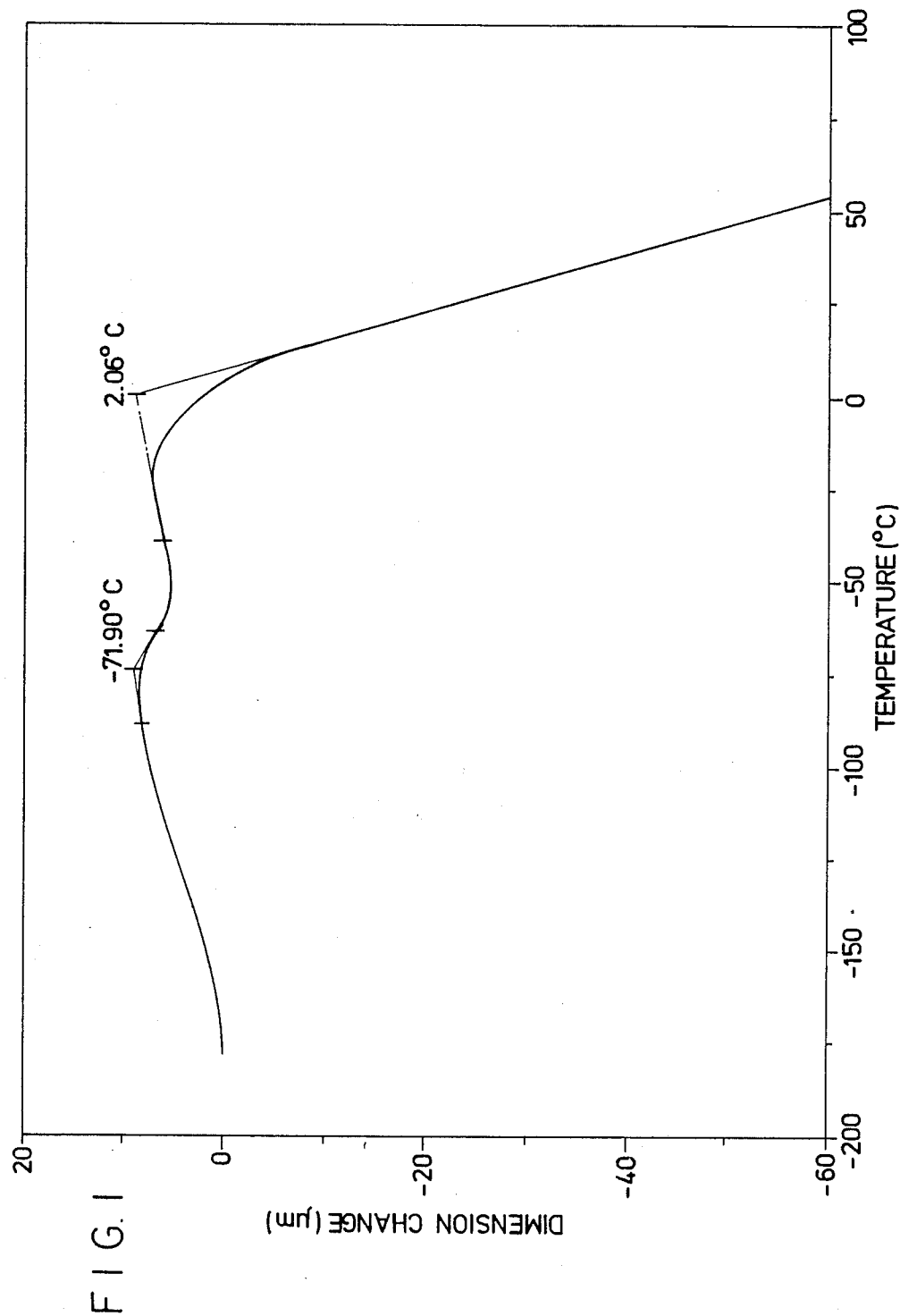
FIG. 1 shows that core shell microgel C has two glass transition temperatures as determined by thermomechanical analysis.

The term microgel as used herein has the meaning set forth above. Thus, by definition, the term excludes a highly crosslinked material such as in U.S. Pat. No. 4,414,278 which discloses substantially nonswellable beads. Since the degree of crosslinking is controlled in manufacture of a microgel, a substantially nonswellable crosslinked polymeric bead (even of proper size) is not a microgel. Generally, the microgels will be present in an average particle size range of from 0.01 to 1 microns and more preferably 0.05 to 0.15 microns.

Core shell microgels can be used to replace all or part of the binder. The term core shell microgel binder, as used herein, refers to binders composed entirely of a core shell microgel and to binders which are blends of a core shell microgel and a preformed macromolecular polymer. The preferred embodiment of this invention is an aqueous processible solid photosensitive composition having a core shell microgel binder composed entirely of the core shell microgel.

Preferably, the core shell microgels of the present invention will swell in at least one of the following solvents: n-heptane, carbon tetrachloride, toluene, methylene chloride, ethyl acetate, acetone, acetonitrile, acetic acid, dimethylsulfoxide, dimethylformamide, formamide, water, aqueous ammonium hydroxide solution containing up to 10% by weight ammonia, aqueous potassium hydroxide solution containing up to 10% by weight potassium hydroxide, methylene chloride-methanol solution containing by weight 92% methylene chloride and 8% methanol, aqueous sodium carbonate solution containing by weight 1% sodium carbonate.

The above list is believed to qualify core shell microgels having a proper degree of crosslinking. However, it is not exhaustive of the list of solvents which will cause core shell microgels to swell.

Swellability can be detected in a variety of ways. One test of swellability is to place a 10 gram sample of the microgel in 100 grams of solvent. The microgel will swell at least 10%, i.e., at least a 10% increase in volume of the microgel. Usually, swelling of at least 50% is more common and swelling increases of at least 100% can be realized with many microgels.

Another way to test swellability is to measure the increase in viscosity of the solvent which is caused by the microgel absorbing solvent. Initially, the viscosity of the solvent is measured using a viscometer, such as a Brookfield viscometer, with a spindle appropriate for the viscosity of the solvent. Ten grams of the core shell microgel is introduced into one hundred grams of the test solution. The material for testing and solvent are stirred at room temperature, about 25° C., for about 24 hours. At the end of the time period, additional test liquid is added to obtain a final weight of 110 grams, 100 grams of solvent and 10 grams of microgel. The viscosity of the microgel dispersion is again measured using the viscometer and a spindle appropriate for the viscosity of the mixture.

The increase in viscosity should be at least 100 centipoise, preferably, 1000 centipoise and, most preferably, 3,000 centipoise. An increase in viscosity which is less than 100 centipoise indicates that the proper degree of cross linking is missing.

The correlation of storage stability and, particularly, lack of substantial cold flow of the photosensitive composition causing edge fusion can be measured by a creep viscosity test. A storage stable composition will have a creep viscosity of at least 50 megapoise, preferably at least 60 megapoise, and most preferably at least 70 megapoise at 40° C.

The core shell microgels of the present invention are conventionally prepared by emulsion polymerization. The microgels are generally formed from 90 to 99.5% by weight polymer component and 10 to 0.5% by weight crosslinking agent with these materials compatible in formation of a continuous phase system. The polymer components can be varied during polymerization to produce core and shell microgel so that the core has less than 10% crosslinking and the shell is designed for aqueous processibility in that an acid-modified copolymer is used to make the shell. Typically, the microgels used in this invention have elastomeric crosslinked cores and aqueous processible elastomeric or thermoplastic non-crosslinked shell. Elastomers, by definition, have glass transition temperatures below room temperature and thermoplastic materials, by definition, have glass transition temperatures above room temperature. It is also possible to use a microgel having a thermoplastic crosslinked core and a thermoplastic non-crosslinked shell. The choice will depend upon the use to which the photosensitive composition is to be put. The preferred microgel for practicing the invention has an elastomeric crosslinked core and an elastomeric non-crosslinked shell.

Core shell microgels can be made from a wide variety of starting materials. Conventionally monoethylenically unsaturated monomers are used in preparing the bulk portion of the microgel, whereas the crosslinking agents contain at least two double bonds.

Suitable monomers are esters of acrylic and methacrylic acid with $C_1$–$C_{18}$ alcohols. There can be mentioned methyl methacrylate, ethyl acrylate, methacrylic acid, butyl methacrylate, ethyl methacrylate, glycidyl methacrylate, styrene and allyl methacrylate, while other useful monomers include acrylonitrile, methacrylonitrile, acrylic acid, butadiene (BD) and 2-ethyl-hexyl acrylate. The preferred monomer for making the core is 2-ethyl-hexyl acrylate. The preferred acid-modified copolymer for the shell is a methacrylic acid-modified n-butyl acrylate.

Other suitable monomers include vinyl ethers and vinyl esters, nitriles and amides of acrylic and methacrylic acid.

A preferred crosslinking agent is butanediol diacrylate (BDDA); while others include ethylene glycol dimethacrylate, tetramethylene glycol diacrylate, trimethylol propane triacrylate, tetraethylene glycol dimethacrylate, methylene bisacrylamide, methylene bis-methacrylamide, divinyl benzene, vinyl methacrylate, vinyl crotonate, vinyl acrylate, vinyl acetylene, trivinyl benzene, glycerine trimethacrylate, pentaerythritol tetramethacrylate, triallyl cyanurate, divinyl acetylene, divinyl ethane, divinyl sulfide, divinyl sulfone, dienes such as butadiene, hexatriene, triethylene glycol dimethacrylate, diallyl cyanamide, glycol diacrylate, ethylene glycol divinyl ether, diallylphthalate, divinyl dimethyl silane, glycerol trivinyl ether and the like.

As was mentioned previously, crosslinking is controlled during manufacture. Thus, core shell microgels having cores with less than 10% crosslinking is accomplished by using 10% or less of the crosslinking agent to crosslink the core, i.e., no crosslinking agent is used to make the shell.

Conventionally one or more monomers and crosslinking agents are dispersed in water with suitable emulsifiers and initiators in manufacture of the microgel. Conventional anionic, cationic or nonionic emulsifiers and water soluble initiators can be employed. Examples of emulsifying agents are sodium lauryl sulfate, lauryl pyridine chloride, polyoxyethylene, polyoxypropylene, colloidal silica, anionic organic phosphates, magnesium montmorillonite, the reaction product of 12 to 13 moles of ethylene oxide with 1 mole of octyl phenol, secondary sodium alkyl sulfates and mixtures thereof. Usually from 0.25 to 4% of emulsifier based on the total weight of reactants is used. Examples of initiators are potassium persulfate, sodium persulfate, ammonium persulfate, tertiary butyl hydroperoxide, hydrogen peroxide, azo bis(isobutyronitrile), azo bis(isobutyroimidine hydrochloride), various redox (reduction-oxidation) systems such as hydrogen peroxide and ferrous sulfate and well known persulfate-bisulfate combinations. Usually from 0.05 to 5% by weight of initiator based on the weight of copolymerizable monomers is used.

Microgels suitable for the practice of the present invention can be produced by the technique of emulsion polymerization as described in U.S. Pat. No. 3,895,082 (Also, British Pat. No. 967,051 teaches a suitable method.) This technique can also be modified by beginning the reaction with one set of monomers and by varying the ratios for the final part of the reaction in order to produce spherical microgels in which the part of the polymer, i.e., the core is different monomeric composition than the outer part of the polymer, i.e., shell. It is also desired that the shell be designed for aqueous processibility. This is achieved by constructing the shell so that it has an acid-modified copolymer. For the present invention, it is desired that the core be elastomeric while the shell can be either elastomeric or thermoplastic.

The art of emulsion polymerization is well known concerning reaction conditions to produce spherical microgels dispersed in a water phase. Unless the dispersion can be used as made and contain no objectionable impurities or byproducts, it is usually necessary to convert the microgels to a solid prior to their use as a photosensitive composition. Well-known techniques of coagulation, filtration, washing and drying may be employed for this purpose. Freeze drying is a particularly useful method for the present invention. Generally the amount of crosslinking agent in the microgel will be less than 20% by weight of the overall weight of the microgel and generally less than 10% by weight.

The weight ratio of the core to the shell is usually in the range from about 4:1 to about 1:4.

Compositions of some of the microgels produced and tested and found useful for the practice of the present invention are set forth in Table 1. All parts are by weight.

TABLE 1

| Core*/Shell Microgel | MICROGEL COMPOSITION | | | | | | | | Core/Shell Weight Ratio |
|---|---|---|---|---|---|---|---|---|---|
| | 2-EHA | BD | BDDA | MMA | nBA | MAA | EA | AA | |
| A Core | 98.5 | — | 0.5 | — | — | — | — | — | A Core/A Shell |
| A Shell[1] | — | — | — | 51 | — | 20 | 29 | — | 2:1 |
| B Core | 98.5 | — | 0.5 | — | — | — | — | — | B Core/B Shell |
| B Shell | — | — | — | — | 80 | 20 | — | — | 2:1 |
| C Core | 98 | — | 1.0 | — | — | — | — | — | C Core/C Shell |
| C Shell | — | — | — | — | 80 | 20 | — | — | 2:1 |
| D Core | — | 100 | — | — | — | — | — | — | D Core/D Shell |
| D Shell | — | — | — | — | 80 | 20 | — | — | 2:1 |
| E Core | — | 100 | — | — | — | — | — | — | E Core/E Shell |
| E Shell | — | — | — | — | 80 | 20 | — | — | 1:1 |
| F Core | 98 | — | 1.0 | — | — | — | — | — | F Core/F Shell |
| F Shell | — | — | — | — | 80 | — | — | 20 | 2:1 |

TABLE 1-continued

MICROGEL COMPOSITION

| Core*/Shell Microgel | 2-EHA | BD | BDDA | MMA | nBA | MAA | EA | AA | Core/Shell Weight Ratio |
|---|---|---|---|---|---|---|---|---|---|
| G Core | 97 | — | 2.0 | — | — | — | — | — | G Core/G Shell |
| G Shell | — | — | — | — | 80 | 20 | — | — | 2:1 |
| H Core | 98 | — | 1.0 | — | — | — | — | — | H Core/H Shell |
| H Shell | — | — | — | — | 80 | — | — | 20 | 1:1 |
| I Core | 98 | — | 1.0 | — | — | — | — | — | I Core/I Shell |
| I Shell | — | — | — | — | 80 | 20 | — | — | 1:1 |
| J Core | 98 | — | 1.0 | — | — | — | — | — | J Core/J Shell |
| J Shell | — | — | — | — | 70 | 30 | — | — | 2:1 |
| K Core | 98 | — | 1.0 | — | — | — | — | — | K Core/K Shell |
| K Shell | 80 | — | — | — | — | 20 | — | — | 2:1 |
| L Core | — | — | 1.0 | — | 98 | — | — | — | L Core/L Shell |
| L Shell | — | — | — | — | 80 | 20 | — | — | 2:1 |
| M Core | 98 | — | 1.0 | — | — | — | — | — | M Core/M Shell |
| M Shell | — | — | — | — | 80 | 20 | — | — | 1:2 |
| N Core | 98 | — | 1.0 | — | — | — | — | — | N Core/N Shell |
| N Shell | — | — | — | — | 80 | 20 | — | — | 1:4 |
| O Core | 98 | — | 1.0 | — | — | — | — | — | O Core/O Shell |
| O Shell | — | — | — | — | 87 | 13 | — | — | 1:1 |

BDDA = butanediol diacrylate
2-EHA = 2-ethylhexyl acrylate
MMA = methyl methacrylate
EA = ethyl acrylate
nBA = n-butyl acrylate
AA = acrylic acid
MAA = methacrylic acid
* = All cores also contained 1% allyl methacrylate (AMA), except D and E.
[1] = This is a thermoplastic shell. Shells B–O are elastomeric.
BD = butadiene Generally, the microgel will be present in an amount from 1 to 90% by weight of the components monomer, initiating system, and microgel.

An example of suitable concentrations by weight in a photosensitive composition based on these constituents is:

(a) from 5% to 50% of an addition polymerizable ethylenically unsaturated monomer;

(b) from 0.01% to 15% of an initiating system activated by actinic radiation;

(c) from 1% to 90% by weight of a core shell microgel; and (d) from 0% to 90% of a preformed macromolecular polymer, if a blend is desired.

Preformed macromolecular polymer, if used in a blend, should contain sufficient acidic or other groups so that the binder is also processible in a semi-aqueous or aqueous developer. Useful aqueous-processible binders include those disclosed in U.S. Pat. Nos. 3,458,311, and 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development, the photosensitive layer will be removed in portions which are not exposed to radiation but the exposed portions will be substantially unaffected during development by a liquid such as wholly aqueous solutions containing 2% sodium carbonate by weight.

Another important aspect of this invention is the addition photopolymerizable unsaturated monomer which partitions in the shell of the microgel binder. Partitioning, in the conventional sense, refers to distribution of a solute between two liquid phases. When a solute is allowed to distribute or partition itself between equal volumes of two immiscible liquids, the ratio of the concentrations of the solute in the two phases, at equilibrium a given temperature, is called the partition coefficient. The term partitioning, as used herein, indicates that the addition polymerizable monomer is distributed predominantly in the domain of the microgel with which it is compatible. Partitioning occurs as the photosensitive element is being made. In the case of melt extrusion, the driving force which causes the monomer to partition in the shell is believed to be the compatibility of the monomer with the aqueous processible shell. In the case of rolling or mixing, the driving force is believed to be imbibition which occurs as the microgel is swelling.

Partitioning of the monomer in a particular domain requires that the host polymer, in this case the microgel, has a domain structure. Discrete domains can be identified by their glass transition temperatures (Tg). Both the core and shell have different Tg's even though they are both elastomeric. Glass transition temperatures can be recorded by a variety of techniques: thermo mechanical analysis (TMA), dynamic mechanical analysis (DMA), and differential scanning calorimetry (DSC). Each technique explores different polymer properties. DSC explores the heat capacity of the polymer. TMA explores the free volume of the polymer above its glass transition temperature. DMA explores the change of modulus.

FIG. 1 shows that core shell microgel C has two glass transition temperatures as determined by thermomechanical analysis.

Figure 2:
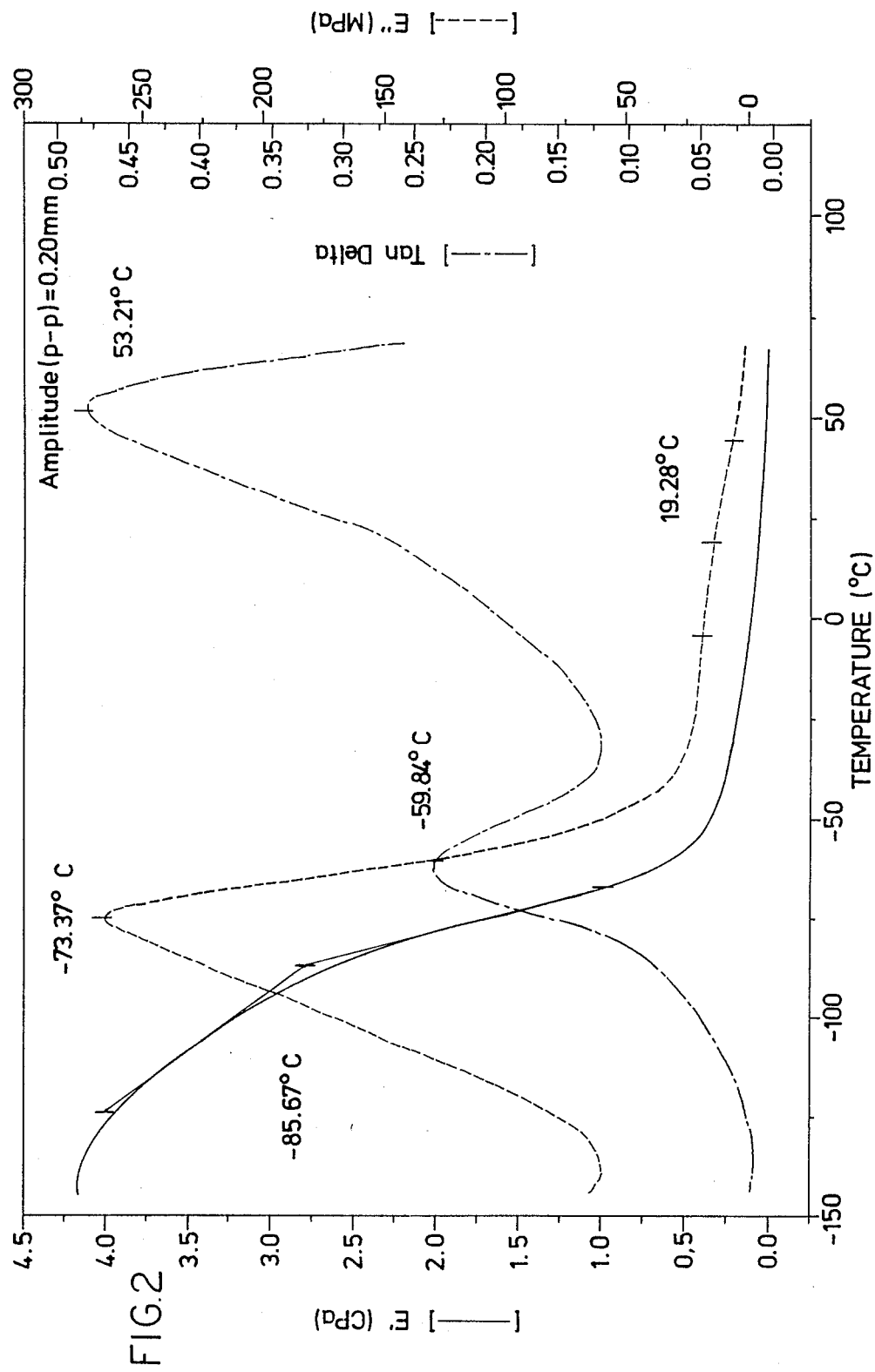
FIG. 2 shows that core shell microgel C has two glass transition temperatures as determined by dynamic mechanical analysis.

FIG. 2 shows that core shell microgel C has two glass transition temperatures as determined by dynamic mechanical analysis.

Figure 3A:
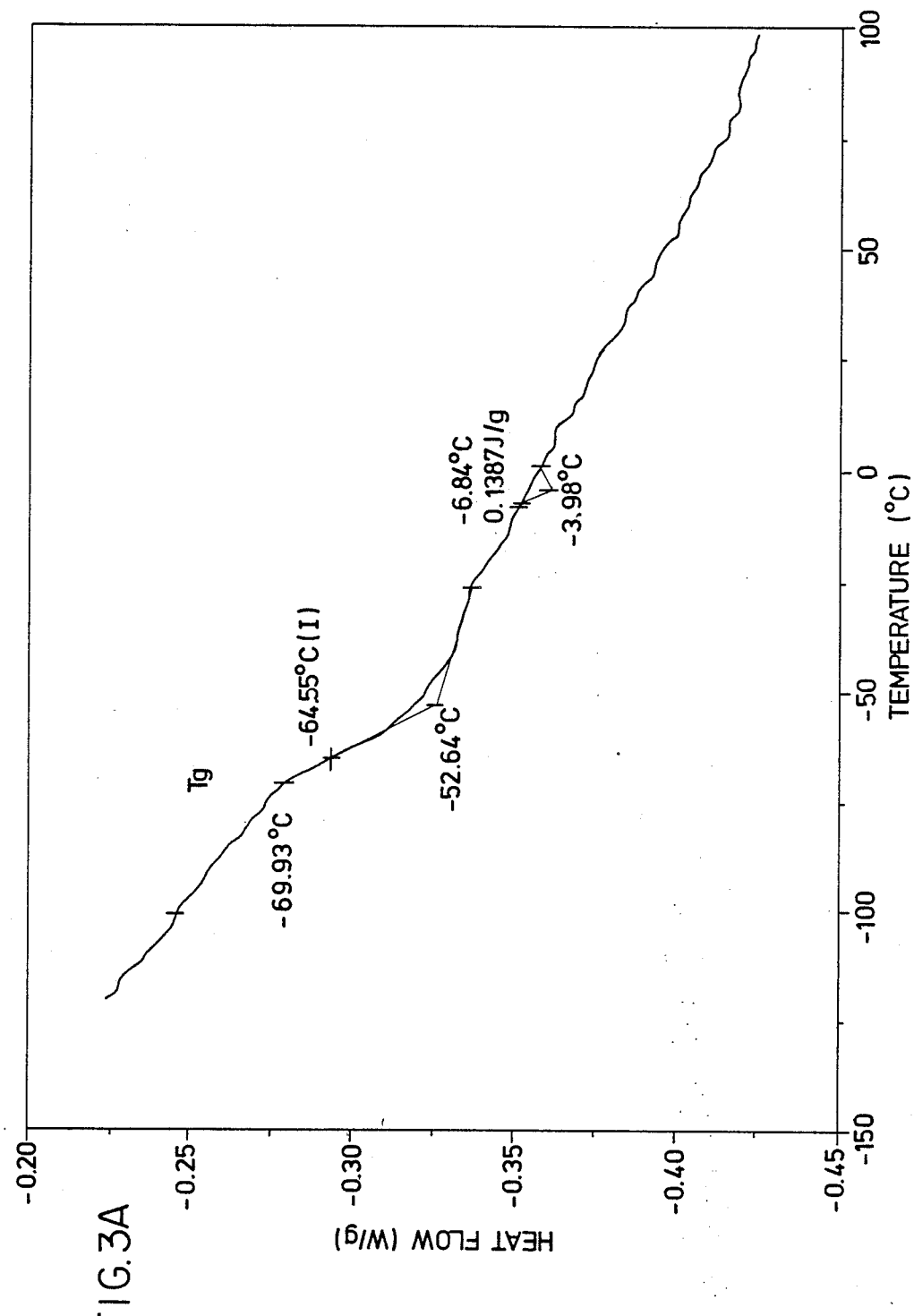
FIG. 3A shows that core shell microgel C has two glass transition temperatures as determined by differential scanning calorimetry.

FIG. 3A shows that core shell microgel C has two glass transition temperatures as determined by differential scanning calorimetry.

Figure 3B:
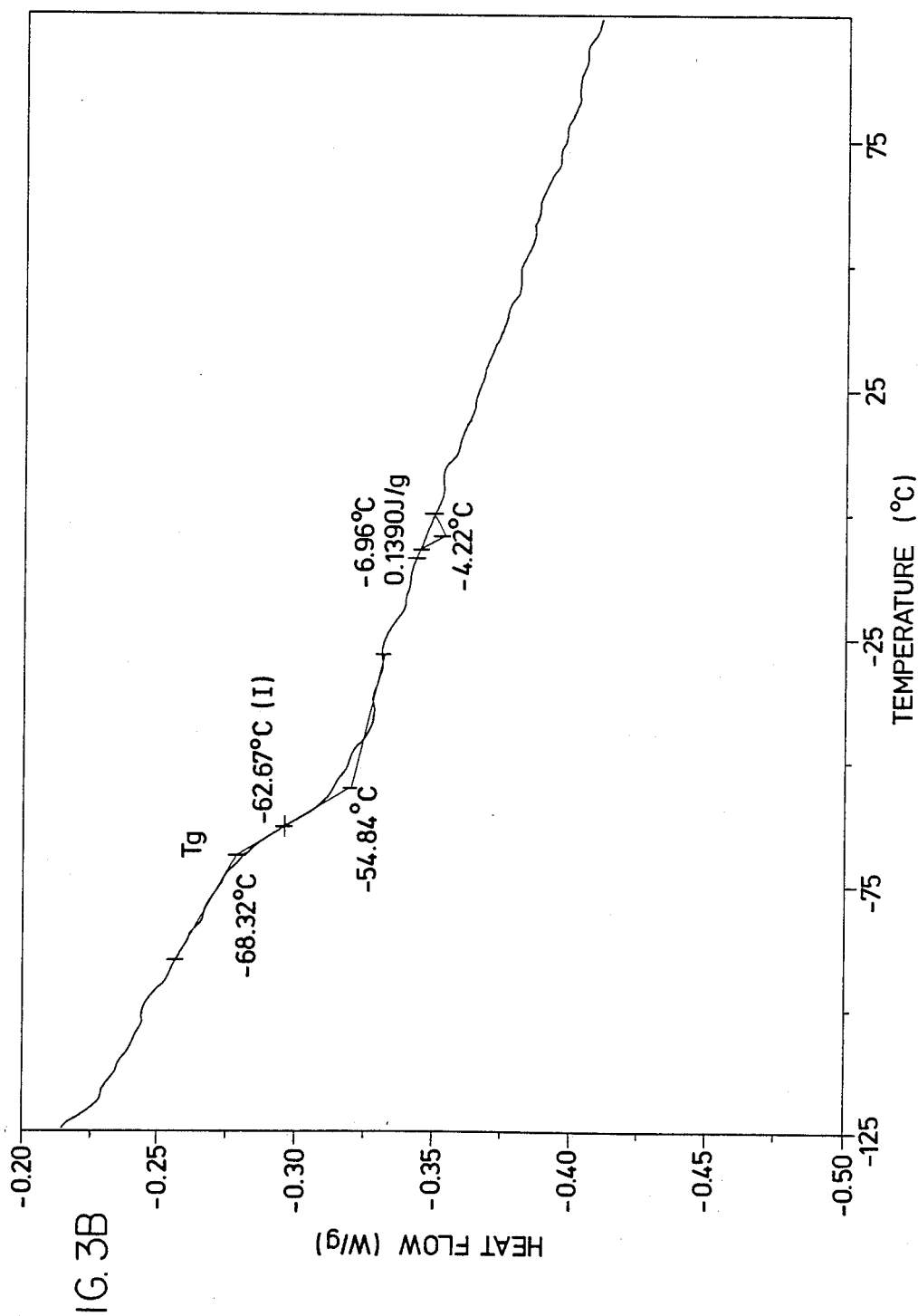
FIG. 3B shows that core shell microgel C has two glass transition temperatures after second heat as determined by differential scanning calorimetry.

FIG. 3B shows that core shell microgel C has two glass transition temperatures after second heat as determined by differential scanning calorimetry.

Table 2 below summarizes the data presented in FIGS. 1 to 3B. The glass transition temperatures fluctuated because the sensitivity of each technique, in responding to the property it is measuring, varies.

TABLE 2

| Technique | Glass Transition Temperature (Tg °C.) | | Figure |
|---|---|---|---|
| | Core C | Shell C | |
| TMA | −71.90 | +2.06 | 1 |
| DMA (loss modulus) | −73.37 | +19.28 | 2 |
| DSC | −69.93 | −6.84 | 3A |
| DSC, 2nd heat | −68.32 | −6.96 | 3B |

These techniques can also be used to confirm where the monomer has partitioned by observing the effect on the glass transition temperature. For example, if the monomer partitions in the core, then a depression of the glass transition temperature of the core will be observed, and if the monomer partitions in the shell, then a depression of the glass transition temperature of the shell will be observed. TMA is preferred to measure depression of Tg of the shell because it is sensitive enough to detect the depression.

Partitioning of the monomer in the shell greatly increases the development rate of the flexographic plate produced from such a photosensitive composition. It is believed that in the areas where the monomer is not exposed to actinic radiation, the monomer then acts like a plasticizer which is easily washed out during development. Because the monomer is believed to act like a plasticizer when not exposed to actinic radiation, it can eliminate the need for a plasticizer altogether.

If a plasticizer is used, it can be any one of the common plasticizers compatible with the microgel binder. Some of the common plasticizers which can be used are dialkyl phthalates, alkyl phosphates, polyethylene glycol, polyethylene glycol esters, polyethylene glycol ethers, and low molecular weight (MW<5000) polybutadienes.

Monomers which partition in the shell should also be capable of forming a high polymer by free-radical initiated chain propagating addition polymerizatio. Suitable monomers can be selected, generally, which have chemical compositions similar to the chemical composition of the aqueous processible outer shell in which it partitions. One class of suitable ethylenically unsaturated compounds includes unsaturated esters of alcohols. The following can also be mentioned: trimethylolpropane triacrylate, poloxyethylated trimethylolpropane triacrylate.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydro-naphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-benzoin and alphaphenylbenzoin. Photoreducible dyes and reducing agents disclosed in U.S. Pat. Nos. 2,850,445; 2,875,047; 3,097,096; 3,074,974; 3,097,097; and 3,145,104, as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tertbutyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

The photosensitive elements of this invention can be made by solvent casting or by extruding, calendering or pressing at an elevated temperature of the photosensitive composition into the form of a layer on a suitable casting wheel, belt or platen as a self-supporting sheet. The layer or sheet may be laminated to the surface of a suitable permanent support or, if necessary, it may be affixed by means of a suitalbe adhesive, or the solution may be coated directly onto a suitable support. The photosensitive elements may have antihalation material beneath the photosensitive layer. For instance, the support may contain an antihalation material or have a layer or stratum of such material on its surface. The elements may be made in the various manners described in Plambeck U.S. Pat. Nos. 2,760,863 and 2,791,504 and McGraw U.S. Pat. No. 3,024,180. The photosensitive layer itself can serve as the light absorption layer, e.g., when dyes or pigments are included in the photosensitive composition or when the layer is sufficiently thick.

The polymerizable layers described herein may be applied to a wide variety of substrates. By substrate is meant any natural or synthetic support. For example, suitable base or support materials include sheets and foils, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate, polyamide, e.g., polyhexamethylenesebacamide; polyimides, e.g., films as disclosed in assignee's Edwards, U.S. Pat. No. 3,179,634 and polyester amide, e.g., polyhexamethylenedipamide adipate. Fillers or reinforcing agents can be present in the synthetic resin or polymer basis such as the various fibers (synthetic modified, or natural), e.g., cellulosic fibers, for instance, cotton, cellulose acetate, viscose rayon, paper; glass wool; nylon and polyethylene terephthalate. These reinforced bases may be used in laminated form. Various anchor layers disclosed in U.S. Pat. No. 2,760,863 can be used to give strong adherence between the support and the photosensitive layer or, in the case of transparent support, pre-exposure through the support to actinic radiation may be useful. The adhesive compositions disclosed in assignee's Burg, U.S. Pat. No. 3,036,913, are also effective.

A transparent cover sheet such as a thin film of polystyrene, polyethylene, polypropylene or other strippable material is used to prevent contamination of or damage to the photosensitive layer during storage or manipulation.

An aqueous release layer is coated onto the cover sheet which is then laminated or extruded onto the surface of the aqueous processible photopolymer plate. The release layer provides a smooth flexible surface which allows easy release from the negative used for imaging. When a blend of a preformed macromolecular polymer and a core shell microgel is used, the preferred release layer is a plasticized polyvinyl alcohol layer which is described in applicant's assignee's, E. I. du Pont de Nemours and Company's, copending patent application filed concurrently herewith, Ser. No. 238103, filing date 8-30-88, incorporated herein by reference.

An important component of the release composition is the polymer which must be processible in an aqueous or semiaqueous development system. It has been found that a substantially hydrolyzed polyvinyl alcohol works well. The polyvinyl alcohol should be hydrolyzed at least 75% and, more preferably, at least 80%. It is possible to work with a fully hydrolyzed polyvinyl alcohol. However, it is less desirable because it would be less soluble in water due to the absence of any acetate groups and, thus, may take longer to be removed from the plate surface during development.

At least 60% substantially hydrolyzed polyvinyl alcohol should be present based on the total weight of the release composition. Preferably, at least 70% should be present and, most preferably, at least 80% should be present.

An important feature of the release composition of this invention is that it contains a plasticizer. For example, low molecular weight polyethylene glycol, Carbowax ® 400 and Carbowax ® 1000 manufactured by Union Carbide, can be used. There can also be mentioned urea, sorbitol and glycerine. The preferred plasticizer for practicing the invention is a low molecular weight polyethylene glycol having an average molecular weight in the range 200–5000.

At least 10% plasticizer is used based on the total weight of the release composition. Preferably, at least 14% plasticizer should be present.

It is believed that the plasticizer reduces the stiffness of the polyvinyl alcohol so that the plasticized polyvinyl alcohol does not wrinkle when the cover sheet is removed. Furthermore, this plasticized release composition provides good release from the transparency through which it is imagewise exposed and the release composition of this invention can be quickly removed by an aqueous or semi-aqueous developer because it is designed to be processible in aqueous or semi-aqueous systems.

Optionally, a surfactant can be added to the plasticized release composition in order to improve coating/wetting of the plasticized release composition on the flexible cover sheet. Any surfactant can be used as long as it is processible in an aqueous system. There can be mentioned fluorinated surfactants, such as, perfluoroalkyl ethoxylate. At least 1.0% of surfactant should be present based on the total weight of the release composition. Preferably, at least 1.5% of surfactant should be present.

In general, the process of preparing a relief printing plate from a photopolymer element includes the steps of main image exposure, development or washout, post-development treatment which includes drying, and post-exposure. Detackification is an optional post-development treatment which can be applied if the surface is still tacky.

A backflash exposure may be used with elements having a transparent support. Backflash generally uses a radiation source emitting a principal wavelength around 360 nm. It serves to sensitize the plate and establishes the depth of the plate relief. The backflash procedure gives the photopolymer layer a uniform and relatively short exposure through the support, thereby photocrosslinking binder and monomer in the support region.

Printing reliefs can be made from a photosensitive composition of this invention by exposing to actinic radiation selected portions of a photosensitive layer through an imagebearing transparency. During the addition-polymerization or cross-linking, the ethylenically unsaturated compound composition is converted to the insoluble state in the radiation-exposed portions of the layer, with no significant polymerization or crosslinking taking place in the unexposed portions or areas of the layer. The unexposed portions of the layer are removed by means of an aqueous or semi-aqueous solvent. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer underneath the clear portions of the transparency. This results in a polymeric relief having its greatest width at the bottom of the photopolymerizable layer, i.e., a frustum, the top surface of the relief being the dimensions of the clear area.

Inasmuch as the free-radical generating systems activatable by actinic radiation generally exhibit their maximum sensitivity in the ultraviolet range, the radiation, preferably having a wavelength range between about 2500 Å and 5000Å Suitable sources of such radiation, in addition to sunlight, include carbon arcs, mercury-vapor arcs, fluorescent lamps with ultraviolet radiation-emitting phosphors, argon glow lamps, lasers, electron flash units and photographic flood lamps. Electron accelerators and electron beam sources through an appropriate mask may also be used. Of these, the mercury-vapor lamps, particularly the sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 60 inches (3.8–153 cm) from the photosensitive composition. Exposure temperatures are preferably operated at about ambient temperatures or slightly higher, i.e., about 20° to about 35° C.

Solvent development may be carried out at about 25° C., but best results are sometimes obtained when the solvent is warm, e.g., 30° to 60° C. Development time can be varied, but it is preferably in the range of about 5 to 25 minutes. Developer may be applied in any convenient manner, including immersion, spraying and brush or rolleer application. Brushing aids in removing the unploymerized or non-crosslinked portions of the composition. Washout is frequently carried out in an automatic processing unit which uses developer and mechanical brushing action to remove the unexposed portions of the plate, leaving a relief constituting the exposed image and floor.

Preferred aqueous developers usually also contain a water miscible organic solvent and an alkaline material. Suitable water miscible organic solvents include isopropanol, butanol, diacetone alcohol, 1-methoxyethanol, 2-ethoxyethanol and 2-n-butoxyethanol. Suitable alkaline materials include alkali metal hydroxides. A preferred aqueous developer is 0.5% sodium hydroxide solution. Other aqueous developer combinations which may be employed are described in U.S. Pat. No. 3,796,602.

Following, development, the relief printing plates are generally blotted or wiped dry, and then dried in a forced air or infrared oven. Drying times and temperatures vary, but drying for 60 to 120 minutes at 60° C. (140° F.) is typical. High temperatures are not recommended as shrinkage of the support may cause registration problems. Additional air drying overnight (16 hours or more) is common. Solvent will continue to evaporate from the printing relief during drying at ambient conditions.

Even after drying, however, photopolymer flexographic printing plates generally retain at least some degree of surface tackiness, particularly on the "shoulders" of the relief and other non-image areas. The surface tackiness is undesirable in a printing relief. It is common practice to employ one of several currently known detackification or "finishing" measures. For example, it is well known in the art that chemical treatment with either dilute aqueous chlorine or bromine, or exposure to short wavelengths irradiation, can reduce this surface tackiness.

Satisfactory detackification of a photopolymer plate which has been developed in an aqueous or semiaqueous solution can be obtained by applying an aprotic organic solvent to the surface of the plate after drying and prior to exposing the printing surface to radiation with wavelengths in the range of 200 nm to 300 nm. This constitutes the subject matter of applicant's assignee, E. I. du Pont de Nemours and Company's, copending patent application, U.S. Ser. No. 096,694, which was filed on Sept. 14, 1987, incorporated herein by reference.

In addition to finishing to remove surface tackiness, most flexographic printing plates are uniformly post-exposed to ensure that the photocrosslinking process is complete and that the plate will remain stable during printing and storage. This "post-exposure" utilizes the same ultraviolet radiation source as the main exposure (usually wavelengths of 300 to 420 nm). Post-exposure is used to complete polymerization and maximize plate hardness and durability, but does not remove tackiness. Post-exposure can occur subsequently, simultaneously, and/or prior to light finishing.

The primary purpose of each exposure step is to affect polymerization, and actinic radiation from a variety of sources can be used, including commercial ultravioletfluorescent tubes, medium, high and low pressure mercury vapor lamps, argon glow lamps, electronic flash units, photographic flood lamps, pulsed xenon lamps, carbon arc lamps, etc. The radiation source must emit an effective amount of radiation having a wavelength in the range of 230 nm to 450 nm, preferably 300 to 420 nm, and more preferably, 340 to 400 nm. For efficient photopolymerization, the wavelength is matched to the absorption characteristics of the photoinitiator present in the photopolymerizable layers. A standard radiation source is the Sylvania 350 Blacklight fluorescent lamp (FR 48T12/350 VL/VHO/180, 115w) which emits actinic radiation having a central wavelength around 354 nm. Exposure times vary from a few seconds to a few minutes, depending on the output of the lamps, distance from the lamps, relief depth desired, and the thickness of the plate.

Printing reliefs made in accordance with this invention can be used in all classes of printing, especially, the flexographic printing class.

The following examples serve to illustrate the practice of the invention. All percentages, ratios and parts are by weight unless otherwise indicated.

EXAMPLE 1

Preparation of Core Shell Microgel C

| Composition | |
|---|---|
| Elastomeric Core C | 2-ethylhexyl acrylate (98%) |
| | 1,4-butanediol diacrylate (1%) |
| | allyl methacrylate (1%) |
| Elastomeric Shell C | n-butyl acrylate (80) |
| | methacrylic acid (20) |
| Core/Shell | 2:1 |

The emulsion polymerization apparatus consisted of a 5 liter, 4 necked flask equipped with a mechanical stirrer, 2 liter addition funnel, thermometer, nitrogen inlet, water cooled condenser and a heating mantle.

Synthesis of Core C

The flask was charged with 1938 grams of deionized water and 30 grams of a 30% aqueous solution of sodium lauryl sulfonate. This surfactant system was heated to 80° C. under a nitrogen atmosphere. At that temperature, 12.5% of a mixture of 1094 grams of 2-ethylhexyl acrylate, 11.2 grams of allyl methacrylate and 11.2 grams of 1,4-butanediol diacrylate was added in one shot. This was followed immediately by the addition of 15 ml of a 7% aqueous solution of sodium phosphate and 15 ml of a 5% aqueous solution of ammonium persulfate. The reaction mixture turned milky and exothermed to 85° C. The remainder of the monomer mixture was added over a period of 90 minutes while maintaining the temperature between 83° to 88° C. When the addition was finished, the reaction mixture was heated for an additional 2 hours at 80° to 85° C. The milky emulsion was filtered to produce a solid content of 35.7% and a particle size 0.09 micron.

Synthesis of Microgel C

The flask was charged with 2000 grams of core emulsion above and 2.7 grams of tert-butyl perpivalate. Over a 32 minute period, a mixture of 1964 grams of deionized water and 2.9 grams of a 30% aqueous solution of sodium laurysulfonate was added. The charge was heated to 60° C. under a nitrogen blanket. At this point, a mixture of 287.6 grams of n-butyl acrylate and 71.9 grams of methacrylic acid was added over a 60 minute period, with the temperature maintained at 80° C. When the addition was completed, the reaction mixture was kept at 80° C. for 90 minutes. The resulting emulsion had a solid content of 25%, a particle size of 0.1 micron, and its acid number was 46.5.

This emulsion was placed in a freezer for 2 days. The coagulated microgel was filtered and washed several times with water. Air drying for 3 days produced a rubbery material.

To test the solubility, 5 grams of the microgel were tumbled in 100 ml aqueous solution of 1% sodium carbonate monohydrate. The microgel was dispersed within a day at ambient.

COMPARATIVE EXAMPLE 1A

Single Stage Microgel

| Composition | |
|---|---|
| 2-ethylhexyl acrylate | 83% |
| Methacrylic acid | 15% |
| 1,4-butanediol diacrylate | 2% |

The apparatus used was the same as that described in Example 1.

Synthesis of Microgel

The flask was charged with 1909 grams of deionized water and 30 grams of a 30% aqueous solution of sodium lauryl sulfonate. The contents of the flask were heated to 80° C. under a nitrogen atmosphere. At that temperature, 12.5% of a mixture of 853 grams of 2-ethylhexylacrylate, 154 grams of methacrylic acid and 20.5 grams of 1,4-butanediol diacrylate was added in one shot. This was followed immediately by the addition of 15 ml of a 7% aqueous solution of sodium phosphate and 15 ml of a 5% aqueous solution of ammonium persulfate. The reaction mixture turned milky and exothermed to 85° C. The remainder of the monomer mixture was added over a period of 90 minutes while maintaining the temperature between 83°-88° C. When the addition was finished, the reaction mixture was heated for an additional 2 hours at 80°-85° C. The milky emulsion which had 35.1% solids, particle size 0.077 micron, acid number 103, was placed in a freezer for 2 days. The coagulated microgel was filtered and washed several times with water. Air drying for 3 days produced a rubbery material.

COMPARATIVE EXAMPLE 1B

Microgel Having a Methacrylic Acid Shell

| Composition | |
|---|---|
| Core | |
| 2-ethylhexylacrylate | 98% |
| allyl methacrylate | 1% |
| 1,4-butanediol diacrylate | 1% |
| Shell | |
| Methacrylic acid | 100% |
| Core/Shell - 14/1 | |

The apparatus used was the same as that described in Example 1.

Synthesis of Core

The flask was charged with 2388 gm of deionized water and 37.5 gm of a 30% aqueous solution of sodium lauryl sulfonate. The contents of the flask were heated to 80° C. under a nitrogen atmosphere. At that temperature, 12.5% of a mixture of 1367.5 gm of 2-ethyl hexyl acrylate, 14 gm of allyl methacrylate and 14 gm of 1,4-butanediol diacrylate was added in one shot. This was followed immediately by the addition of 19 ml of a 7% aqueous solution of sodium phosphate and 20 ml of a 5% aqueous solution of ammonium persulfate. The reaction mixture turned milky and exothermed to 86° C. The remainder of the monomer mixture was added over a period of 90 minutes while maintaining the temperature between 84°-87° C. When the addition was finished, the reaction mixture was heated for another 2 hours at 80°-85° C. The milky emulsion was filtered. Solid content 35.8%; particle size 0.097 micron.

Synthesis of Microgel

The emulsion polymerization apparatus was described above.

The flask was charged with 1000 gm of core emulsion above and 0.3 gm of tertiary butyl perpivalate. Over a 30 minute period, a mixture of 511.4 gm of deionized water and 0.2 gm of a 30% aqueous solution of sodium lauryl sulfonate was added. The charge was heated to 60° C. under a nitrogen atmosphere. At this point, 23.6 gm of methacrylic acid was added over a 60 minute period, with the temperature maintained at 80° C. When the addition was completed, the reaction mixture was kept at 80° C. for 90 minutes. Solid content 24.6%; particle size 0.1 micron; acid number 41.7.

The solid polymer was isolated as described in the previous example.

COMPARATIVE EXAMPLE 1C

Microgel Having 10% Crosslinked Core

| Composition | |
|---|---|
| Core | |
| 2-ethyl hexyl acrylate | 89 |
| allyl methacrylate | 1 |
| 1,4-butanediol diacrylate | 10 |
| Shell | |
| n-butyl acrylate | 80 |
| methacrylic acid | 20 |
| Core/Shell - 2/1 | |

The apparatus used was the same as described above in Example 1.

Synthesis of Core

The flask was charged with 955.4 gm of deionized water and 15 gm of a 30% aqueous solution of sodium lauryl sulfonate. The reaction mixture was heated to 80° C. under a nitrogen atmosphere. At that temperature, 12.5% of a mixture of 496.8 gm of 2-ethyl hexyl acrylate, 5.6 gm of allyl methacrylate and 55.8 gm of 1,4-butanediol diacrylate was added in one shot. This was followed immediately by the addition of 7.5 ml of a 7% aqueous solution of sodium phosphate and 8 ml of a 5% aqueous solution of ammonium persulfate. The reaction mixture turned milky and exothermed to 85° C. The remainder of the monomer mixture was added over 90 minutes while maintaining the temperature between 83°-86° C. When the addition was finished, the reaction mixture was heated an additional 2 hours at 80°-85° C. The milky emulsion was filtered. Solid content 35.8%; particle size 0.08 micron.

Synthesis of Microgel

The emulsion polymerization apparatus was described above.

The flask was charged with 1100 gm of core emulsion above, and to it was added with stirring over 25 minutes, a mixture of 1069 gm of deionized water, 1.58 gm of a 30% aqueous solution of sodium layryl sulfonate. The charge was heated to 60° C. under a nitrogen atmosphere. At this point, a mixture of 157.8 gm of butyl acrylate and 39.3 gm of methacrylic acid was added over a 60 minute period, with the temperature maintained at 80° C. When the addition was completed, the reaction mixture was kept at 80° C. for 90 minutes. Solid content 24.2%; particle size 0.085 micron; acid number 46.8.

The solid polymer was isolated as described in previous examples.

COMPARATIVE EXAMPLE 1D

Two-Stage Microgel Having a Crosslinked Core and a Crosslinked Shell

Synthesis of Core

The flask was charged with 2627 grams of deionized water and 41.25 gm of a 30% aqueous solution of a sodium lauryl sulfonate. The contents of the reaction flask were heated to 80° C. under a nitrogen atmosphere. At that temperature, 12.5% of a mixture of 1504 gm of 2-ethylhexyl acrylate, 15.4 gm of allyl methacrylate, and 15.4 gm of 1,4-butanediol diacrylate was added in one shot. This was followed immediately by the addition of 21 ml of a 7% aqueous solution of sodium phosphate and 22 ml of a 5% aqueous solution of ammonium persulfate. The reaction mixture turned milky and exothermed to 83° C. The remainder of the monomer mixture was added over a period of 90 minutes while maintaining the temperature between 83° C. and 85° C. When the addition was finished, the reaction mixture was heated for an additional 2 hours at 82°-85° C. The milky emulsion was filtered. Solid content 35.6%; particle size 0.073 micron.

Synthesis of Microgel

The flask was charged with 2000 grams of core emulsion above and 2.9 grams of tertiary butyl perpivalate. Over a 30 minute period, a mixture of 1964 grams of deionized water and 2.9 gm of a 30% aqueous solution of sodium lauryl sulfonate was added. The reaction mixture was heated to 60° C. under a nitrogen atmosphere. At this point, a mixture of 287.6 gm of butyl acrylate, 76 gm of methacrylic acid, and 3.6 gm of 1,4-butanediol diacrylate was added over a 60 minute period while maintaining the temperature at 80° C. When the addition was completed, the reaction mixture was kept at 80° C. for 90 minutes. Solid content 23.7%; particle size 0.078 micron; acid number 45.5.

The solid microgel was isolated as previously described.

COMPARATIVE EXAMPLE 1E

Single Stage Microgel

The synthesis of this comparative microgel is described in Example 2 of U.S. Pat. No. 4,726,877.

COMPARATIVE EXAMPLE 1F

Thermoplastic Crosslinked Core and Elastomeric Non-Crosslinked Shell

Synthesis of Core

The flask was charged with 2627 gm of deionized water and 41.25 gm of a 30% aqueous solution of sodium lauryl sulfonate. The reaction mixture was heated to 80° C. under a nitrogen atmosphere. At that temperature, 12.5% of a mixture of 1504 gm of methyl methacrylate, 15.4 gm of allyl methacrylate, and 15.4 gm of 1,4-butanediol diacrylate was added in one shot. This was followed immediately by the addition of 21 ml of a 7% aqueous solution of sodium phosphate and 2 ml of a 5% aqueous solution of ammonium persulfate. The reaction mixture turned milky and exothermed to 84° C. The remainder of the monomer mixture was added over a period of 90 minutes while maintaining the temperature between 82° C. and 86° C. When the addition was finished, the reaction mixture was heated for an additional 2 hours at 80°-85° C. The milky emulsion was filtered. Solid content 36.6%; particle size 0.073 micron.

Synthesis of Microgel

The flask was charged with 2000 grams of core emulsion above and 2.9 gm of tertiary butyl perpivalate. Over a 30 minute period, a mixture of 1964 gm of deionized water and 2.9 gm of a 30% aqueous solution of sodium lauryl sulfonate was added. The reaction mixture was heated to 60° C. under a nitrogen atmosphere. At this point, a mixture of 287.6 gm of butyl acrylate and 71.9 gm of methacrylic acid was added over a 60 minute period, with the temperature maintained at 80° C. When the addition was completed, the reaction mixture was kept at 80° C. for 90 minutes. Solid content 24.4%; particle size 0.078 micron; acid number 51.1.

The solid microgel was isolated as previously described.

COMPARATIVE EXAMPLE 1G

Thermoplastic Crosslinked Core and Thermoplastic Non-Crosslinked Shell

Synthesis of Core

The core used in this example is the same as the one used in Comparative Example 1F.

Synthesis of Microgel

The flask was charged with 2000 gm of core emulsion above and 2.9 gm of tertiary butyl perpivalate. Over a 30 minute period, a mixture of 1964 gm of deionized water and 2.9 gm of a 30% aqueous solution of sodium lauryl sulfonate was added. The charge was heated to 60° C. under a nitrogen blanket. At this point, a mixture of 188.3 gm of methyl methacrylate, 104.2 gm of ethyl acrylate, and 71.9 gm of methacrylic acid was added over a 60 minute period while maintaining the temperature at 80° C. When the addition was completed, the reaction mixture was kept at 80° C. for 90 minutes. Solid content 24.2%; particle size 0.078 micron; acid number 48.1.

The solid microgel was isolated as previously described.

EXAMPLE 2

(a) Preparation of a Resin Plate Containing Microgel C

A resin plate (4"×4") was prepared by pressing 30 grams of microgel synthesized in Example 1 between 2 sheets of 5 mil Mylar ® polyester film, using a Carver Laboratory Press, Model 2000-129 from Fred S. Carver, Inc., Summit, N.J., U.S.A. The press cycle was the equilibration at 150° C., followed by 2 minutes at 5000 psi and 1 minute at 10000 psi. The microgel filled the mold. The plate was uniform, transparent, 123 mil thick with durometer (Shore A) 58 and 10% resilience. Resilience was tested according to ASTM D-2632 with a Shore Resiliometer Model SR-1 from the Shore Instrument & Mfg. Co., Inc., Freeport, N.Y., U.S.A.

(b) Preparation of Photosensitive Element Containing Microgel C

To prepare a photopolymer, the solution mixture of 276 grams methylenechloride and 24 grams methanol was charged to a 950 ml amber bottle and the following components added:

| | |
|---|---|
| trimethylolpropane ethoxy triacrylate | 25 grams |
| 2,2-dimethoxy-2-phenylacetophenone | 4 grams |
| microgel C (Table 1) | 71 grams |

On a roller mill for 16 hours, the mixture (25% solids) turned into a clear, gelatinous mass. 1 ml (equiv. 0.01% colorant) of a solution containing 1 gram C.I. Basic Green 4 (C.I. #42000) in 100 ml methanol was added.

The mixture was charged to a rubber mill (6"×12") at 100° C. to flash the solvent mixture, followed by milling for 15 minutes at 100° C. The photopolymer was rubbery.

A plate (4"×4") was pressed at 100° C. from 30 grams of photopolymer using the press and cycle above. The support base was 8.5 mil Cronar ® polyester film, coated with an adhesive layer containing a yellow antihalation dye. The adhesive layer contained 33.26 parts polyvinylidene chloride, 0.317 part polymethylmethacrylate beads, 1.51 parts oxanol yellow dye and 0.053 part surfactant (Zonyl FSN, E. I. du Pont de Nemours & Co., Wilmington, Delaware). Oxanol yellow dye was 4-((3-methyl-5-oxo-1-(4-sulfophenyl)-2-pyrazolin-4-ylidene)-methyl)-3-methyl-1-(4-sulfophenyl)-2-pyrazolin-5-one. The coversheet was 5 mil Mylar ® polyester film coated with polyvinyl alcohol at 40 mg/dm$^2$.

The coversheet was peeled with the release layer remaining adhered to the photopolymer surface. The plate was 120 mil thick with durometer 6 and 21% resilience.

The plate was exposed for 1517 millijoules to a Riston ® PC-130 exposure unit (E. I. du Pont de Nemours & Co., Inc., Wilmington, DE, U.S.A.) through a phototool. The exposure produced a photofugitive image. The imaged plate tested at durometer 86 and 22% resilience.

The imaged plate was developed with 0.5% aqueous sodium hydroxide solution for 5 minutes at 140° F. in a Cyrel ® Aqueous Processor (E. I. du Pont de Nemours & Co., Inc., Wilmington, DE, U.S.A.), then dried for 1 hour at 140° F. The relief was 77 mil, calculated at a development rate of 15.4 mil/minute. The plate tested at durometer 89 and 22% resilience.

The procedure described in Example 2 was used to prepare resin plates and photosensitive elements containing microgels from Comparative Examples 1A-1E.

Table 3A presents data showing the relative solubilities of microgel C described in Example 1 and comparative microgels 1A-1E in a 1% $Na_2CO_3H_2O$ solution. Table 3B presents a resin evaluation of the plates containing microgel C described in Example 1 versus photosensitive elements containing comparative microgels 1A-1E.

TABLE 3A

| | Solubility |
|---|---|
| | Solubility (1% $Na_2CO_3H_2O$) |
| Microgel C | Dispersion |
| Comparative Microgel 1A | Very slight swelling[1] |
| Comparative Microgel 1B | Suspension[1] |
| Comparative Microgel 1C | Opalescent gel |
| Comparative Microgel 1D | Dispersion |
| Comparative Microgel 1E | Dispersion |

[1]Clear supernatant; unchanged after acidification w/10% $H_2SO_4$

TABLE 3B

Resin Evaluation of Plates Containing Microgel C and Comparative Microgels 1A-1E

| Plate Containing | Flow (150° C.) | Appearance | Thickness (mil) | Durometer (A) | Resilience (%) |
|---|---|---|---|---|---|
| Microgel C | Good | Transparent | 123 | 58 | 10 |
| Comp. Microgel 1A | Fair | Grainy | 122 | 65 | 16 |
| Comp. Microgel 1B | No Fusion | Chunks | — | — | — |
| Comp. Microgel 1C | Poor | Warped/Grainy | 150 | 76 | 21 |
| Comp. Microgel 1D | Good | Transparent | 123 | 64 | 13 |
| Comp. Microgel 1E | No Fusion | Compressed Powder | — | — | — |

Table 4 presents an evaluation of photosensitive elements containing microgel C and comparative microgels 1A-1E. The development rates for each element were obtained by comparing them individually against the element containing the preferred microgel. In all cases, the element containing the preferred microgel C (described in Example 1), had the best development rate.

TABLE 4

| | Photosensitive Element Containing | | | | | |
|---|---|---|---|---|---|---|
| | | Comparative Microgel | | | | |
| | Microgel C | 1A | 1B | 1C | 1D | 1E |
| Raw Plate | | | | | | |
| Appearance | Uniform | Unif. | 2 | Unif. | Unif. | 3 |
| Thickness (mil) | 120 | 122 | | 117 | 116 | |
| Durometer (A) | 6 | 27 | | 43 | 20 | |
| Resilience (%) | 21 | 7 | | 13 | 15 | |
| Imaging | | | | | | |
| Millijoules | 1517 | 1566 | | 1620 | 1504 | |

TABLE 4-continued

| | Photosensitive Element Containing | | | | | |
|---|---|---|---|---|---|---|
| | | Comparative Microgel | | | | |
| | Microgel C | 1A | 1B | 1C | 1D | 1E |
| Durometer (A) | 86 | 84 | | 90 | 87 | |
| Resilience (%) | 22 | 20 | | 31 | 22 | |
| Development | | | | | | |
| Durometer (A) | 89 | 85 | | 86 | 89 | |
| Resilience (%) | 22 | 20 | | 32 | 21 | |
| Relief (Mil) | 77 | 33 | | 63 | 76 | |
| Dev.Rate[1] (Mil/Min) | 15.4 | 6.6 | — | — | | |
| | 15.8 | — | | — | 15.2 | |
| | 14.0 | — | | 12.6 | | |

[1] The development rate for each element containing comparative microgels 1A-1E was compared to the development rate obtained for the element containing microgel C in three separate experiments. The results of all three experiments are presented. Elements containing comparative microgels 1B and 1E could not be made.
[2] Charge dropped from mill after solvent was flashed.
[3] Poor flow; hard, very brittle plate.

The results presented in Table 4 show that the element containing comparative microgel 1A had a development rate of 6.6 mil/min versus a 15.4 mil/min development rate for the element containing the preferred microgel (microgel C, Table 1).

Photopolymer containing comparative microgel 1B (which had a shell consisting entirely of methacrylic acid) did not melt to produce a resin plate.

Photopolymer containing comparative microgel 1C, which had a core shell microgel with a 10% crosslinked core, had a lower development rate of 12.6 mil/min versus a 14 mil/min development rate for microgel C.

The photosensitive element containing comparative core shell microgel (1D) had a development rate of 15.2 mil/min. The photosensitive element containing microgel C had a development rate of 15.8 mil/min.

Photopolymer containing comparative microgel 1E, which contained microgel B, Table 1 of U.S. Pat. No. 4,726,877, flowed very poorly. The resin plate was cracked and very brittle.

EXAMPLE 3

Synthesis of Microgel A Having Crosslinked Elastomeric Core and Thermoplastic Shell

Synthesis of Core

The flask was charged with 2128 grams of deionized water and 33 gm of a 30% aqueous solution of sodium lauryl sulfonate. The reaction mixture was heated under nitrogen to 80° C. At that temperature, 12.5% of a mixture of 1203 gm of 2-ethyl hexyl acrylate, 6 gm of allyl methacrylate, and 6 gm of 1,4-butanediol diacrylate was added in one shot. This was followed immediately by the addition of 16.3 ml of a 7% aqueous solution of sodium phosphate and 16.3 ml of a 5% aqueous solution of ammonium persulfate. The reaction mixture turned milky and exothermed to 85° C. The remainder of the monomer mixture was added over 90 minutes while maintaining the temperature between 83° C. and 85° C. When the addition was finished, the reaction mixture was heated for an additional 2 hours at 83°-88° C. The milky emulsion was filtered. Solid content 35.4%; particle size 0.1 micron.

Synthesis of Microgel A

The flask was charged with 2250 gm of core emulsion above and 3.2 gm of tertiary butyl perpivalate. Over a 30 minute period 1950.5 gm of deionized water was added. The charge was heated to 60° C. under a nitrogen blanket. At this point, a mixture of 203.4 gm of methyl methacrylate, 115.7 gm of ethyl acrylate, and 79.8 gm of methacrylic acid was added over a 60 minute period, with the temperature maintained at 80° C. When the addition was completed, the reaction mixture was kept at 80° C. for 90 minutes. Solid content 25.7%; particle size 0.111 micron; acid number 45.

The solid microgel was isolated as previously described.

The procedure described in Example 2 was used to prepare resin plates and photosensitive elements containing comparative microgels from comparative examples 1F and 1G.

Table 5A presents data showing relative solubilities in a 1% $Na_2CO_3H_2O$ solution of microgel C described in Example 1, comparative microgels 1F and 1G, and microgel A described in Example 3.

TABLE 5A

| | Solubility |
|---|---|
| | Solubility (1% $Na_2CO_3H_2O$) |
| Microgel C | Dispersion |
| Microgel A | Dispersion |
| Comparative Microgel 1F | Dispersion |
| Comparative Microgel 1G | Dispersion |

Table 5B presents a resin evaluation of plates containing microgel C, microgel A, and comparative microgels 1F and 1G.

TABLE 5B

| | Resin Evaluation Plates Containing | | | |
|---|---|---|---|---|
| | | | Comparative Microgels | |
| | Microgel C | Microgel A | 1F | 1G |
| Resin Plate | | | | |
| Flow (150° C.) | Good | Good | Very Poor[1] | Poor[2] |
| Appearance | Transparent | Transparent | — | — |
| Thickness (mil) | 118 | 116 | — | — |
| Durometer (A) | 50 | 95 | — | — |
| Resilience (%) | 9 | 32 | — | 3[3] |

[1] Compacted powder.
[2] Polymer fused in center of mold only; warped plate.
[3] Plate shattered under impact of probe.

Table 6A presents an evaluation of photosensitive elements containing Microgel A versus photosensitive element containing Microgel C.

TABLE 6A

| Comparison of Photosensitive Element Containing Microgel C versus Microgel A | | |
|---|---|---|
| | Photosensitive Element Containing Microgel | |
| | C | A |
| Raw Plate | | |
| Appearance | Uniform | Uniform |
| Thickness (mil) | 120 | 119 |
| Durometer (A) | 6 | 25 |
| Resilience (%) | 21 | 5 |
| Imaging | | |
| Millijoules | 1517 | 1566 |
| Durometer (A) | 86 | 95 |
| Resilience (%) | 22 | 38 |
| Development | | |
| Durometer (A) | 89 | 95 |
| Resilience (%) | 22 | 36 |
| Relief (mil) | 77 | 43 |
| Development Rate (mil/min) | 15.4 | 8.6 |

The results from Table 6A show that the element containing microgel C had a higher development rate than the element containing microgel A: 15.8 mil/min versus 8.6 mil/min, respectively.

Table 6B presents a comparison of plates made from photopolymer containing microgel C versus plates made from comparative photopolymers containing comparative microgels 1F and 1G.

TABLE 6B

Comparison of Photosensitive Elements Containing Microgel C, Microgels 1F and 1G

| | Photosensitive Element Containing | | |
|---|---|---|---|
| | Microgel C | Comp. Microgel 1F | Comp. Microgel 1G |
| Raw Plate | | | |
| Appearance | Uniform | Uniform | Uniform |
| Thickness (mil) | 117 | 116 | 116 |
| Durometer (A) | 16 | 94 | 95 |
| Resilience (%) | 17 | 23 | 23 |
| Imaging | | | |
| Millijoules | 1489 | 1386 | 1471 |
| Durometer (A) | 90 | 94 | 95 |
| Resilience (%) | 23 | 41 | 46 |
| Development | | | |
| Durometer (A) | 89 | 93 | 95 |
| Resilience (%) | 22 | 45 | 51 |
| Relief (mil) | 79 | 16 | 6 |
| Development Rate mil/min) | 15.8 | 3.2 | 1.2 |

The results from Table 6B show that the element containing microgel C had the best development rate.

EXAMPLE 4

Melt Extrusion

The photopolymer composition discussed in Example 2 above was prepared via melt extrusion without solvent. The extruded polymer was calendered between a cover and support sheet to a total thickness of 42 mils. The cover sheet was 5 mil Mylar ® coated with polyvinyl alcohol (40 mg/dm$^2$) and the support sheet was 8.5 mil Cronar ® coated with an adhesive layer and yellow antihalation dye as discussed in Example 2. The photopolymer plate was exposed to actinic radiation using the Cyrel ® 3040 Exposure Unit (E. I. du Pont de Nemours & Co., Wilmington, Delaware), and washed out in 0.5% NaOH. The relief image held a 2% highlight and 5 mil isolated dot.

EXAMPLE 5

Determination of Monomer Partitioning (a) Partitioning of HMDA in the Core

A photosensitive element containing 30% HMDA and 66% core shell microgel C was prepared as described in Example 2.

Figure 4A:
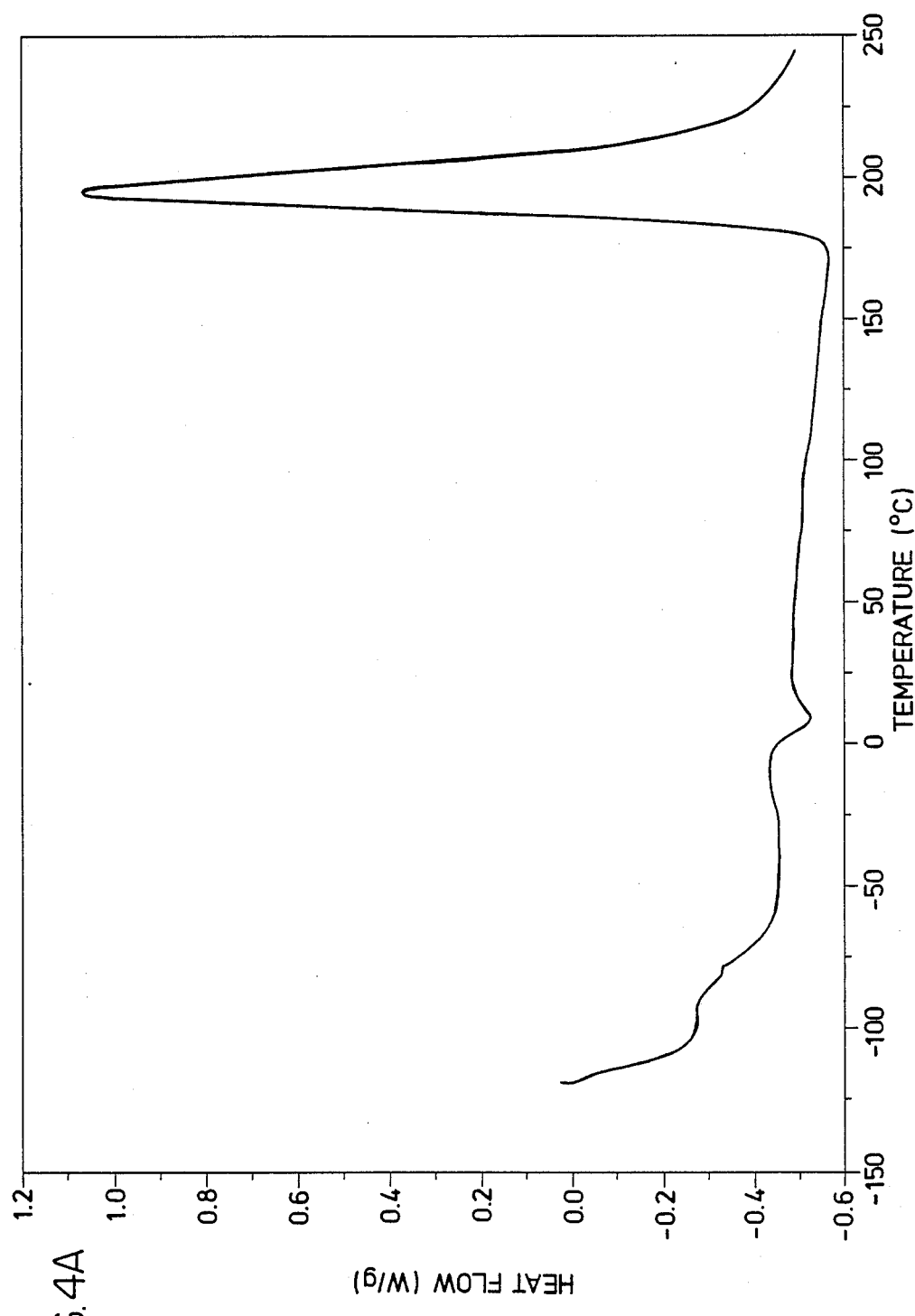
Figure 4B:
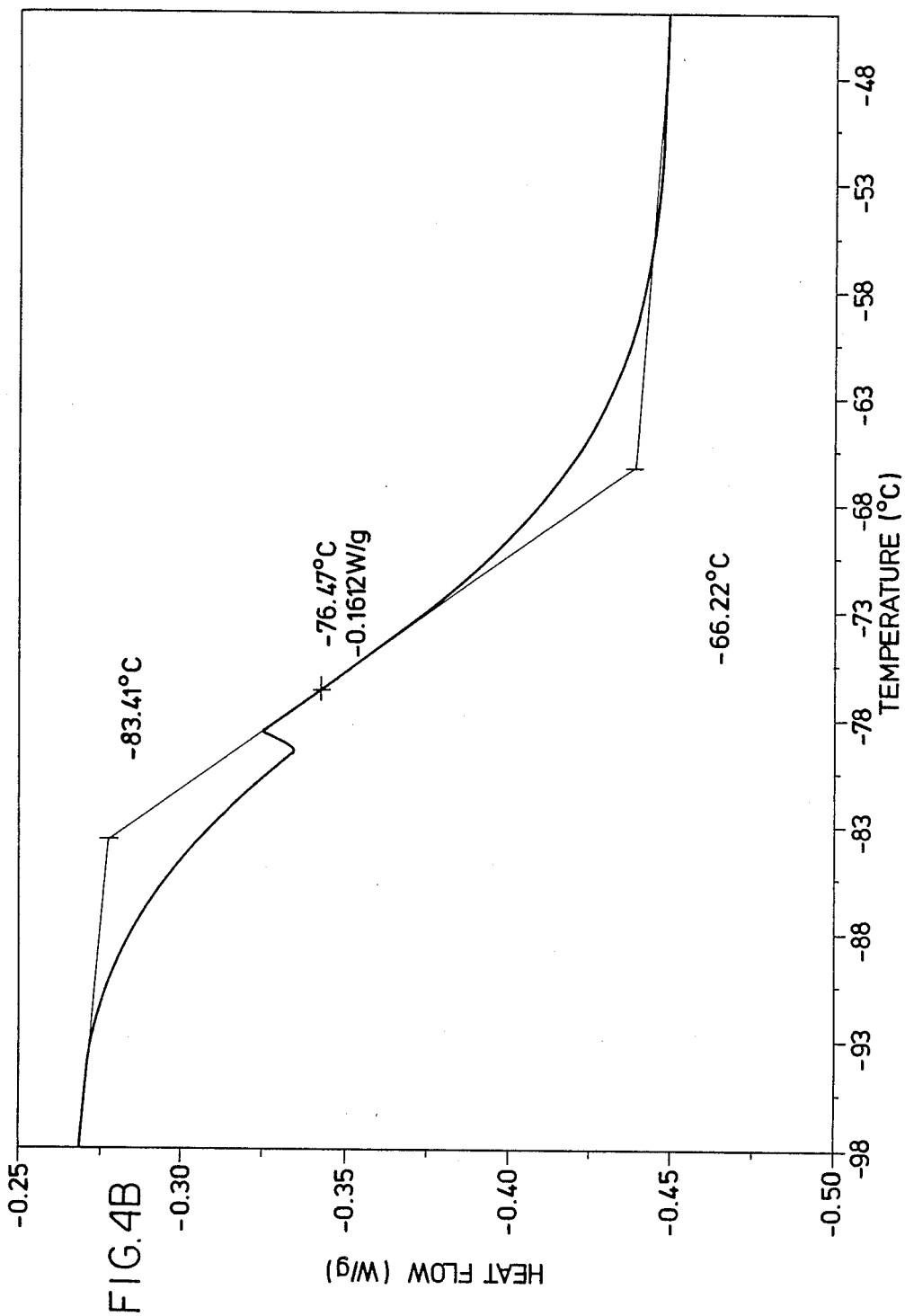
Figure 4C:
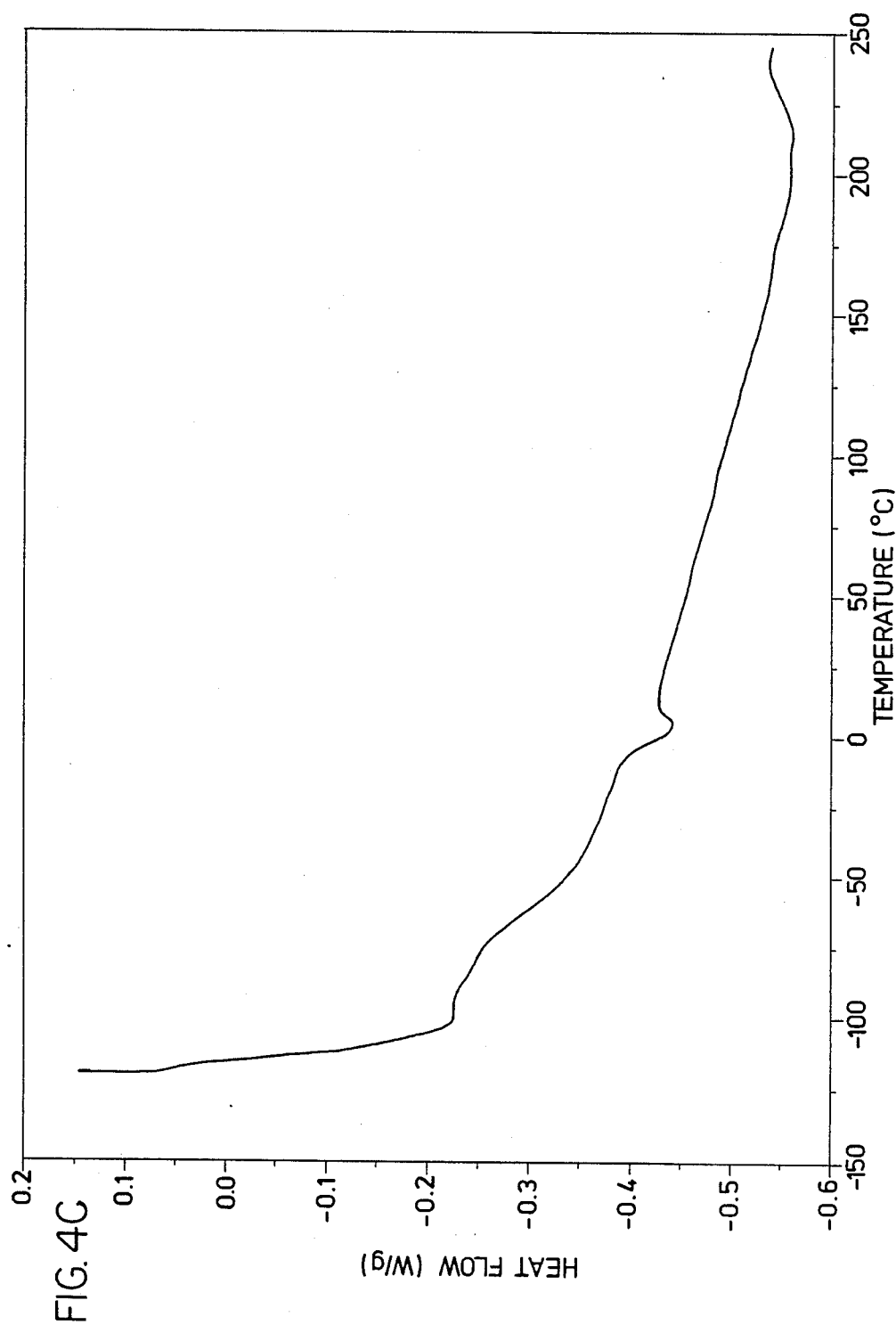
Figure 4E:
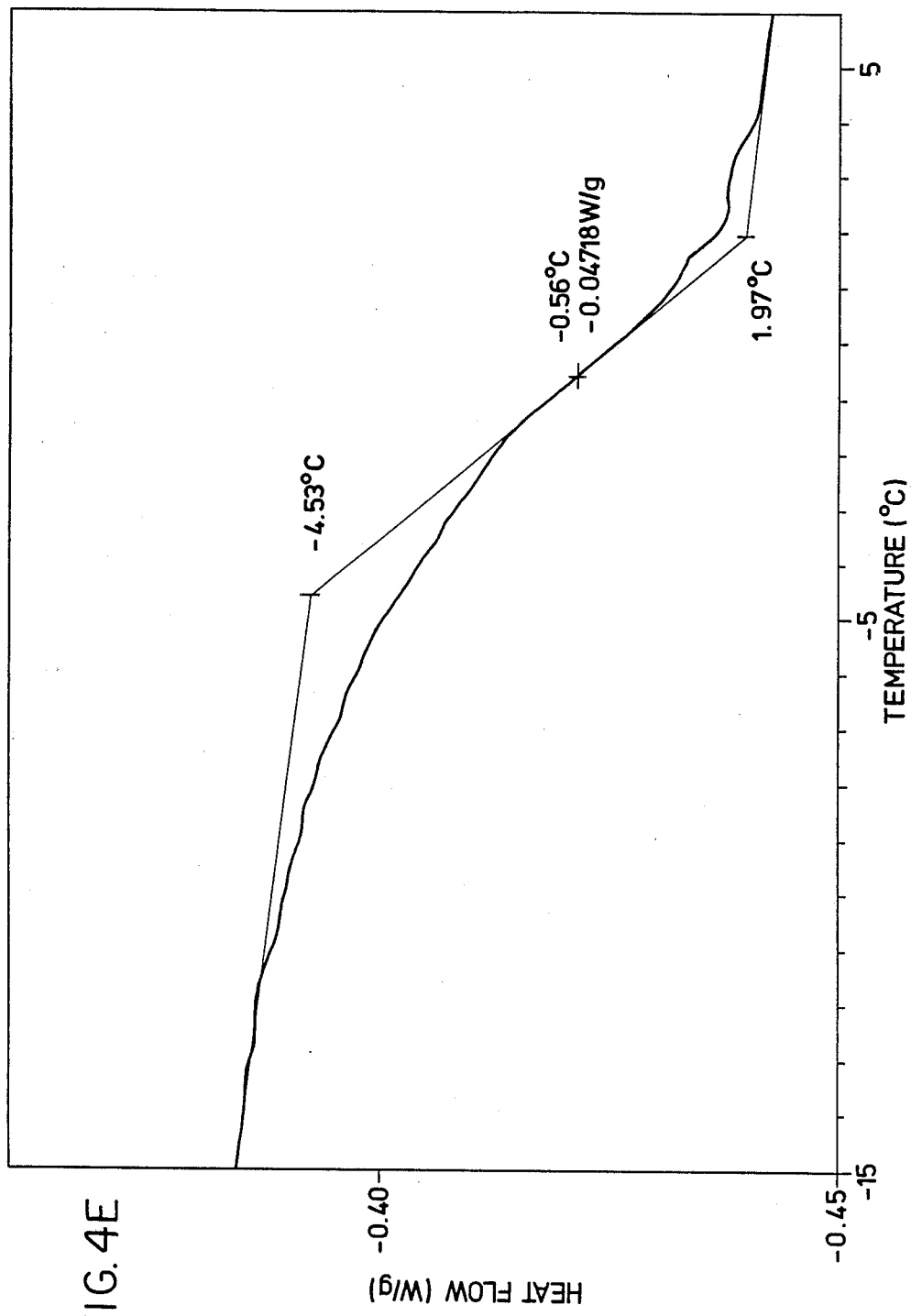

The element was scanned in a Du Pont 910 Differential Scanning Calorimeter from −120° C. to 250° C. at a constant rate of 20° C./minute (FIG. 4A). The Du Pont 9900 Computer/Analyzer identified a glass transition at −83.41° C. (FIG. 4B). The monomer was thermally polymerized, as shown by the strong exotherm between +150° C. and +200° C. (FIG. 4A). The sample was then cooled to −120° C. and reheated to +250° C. at a constant rate of 20° C./minute. All monomer was polymerized during the first scan, as evidenced by the absence of any exotherm between +150° C. and +200° C. during the second scan (FIG. 4C). A glass transition temperature was recorded at −68.98° C. (FIG. 4D).

The glass transition temperature of core microgel C earlier was recorded (DSC mode) at −69.93° C. (Table 2; FIG. 3A) and −68.32° C. after the second scan (Table 2; FIG. 3B). With the glass transition temperature of the core depressed to −83.41° C. (FIG. 4B) and recovered at −69.97° C. (FIG. 4D) after deplasticization of the core by the thermal polymerization of the monomer during the first scan, it was concluded that HMDA monomer partitioned in the core.

(b) Partitioning of TMPEOTA in the Shell

A photosensitive element containing 20% trimethylolpropane ethoxy triacrylate (TMPEOTA) and 76% microgel C was prepared as described in Example 2.

The photosensitive element was clear and did not exude monomer.

Figure 5A:
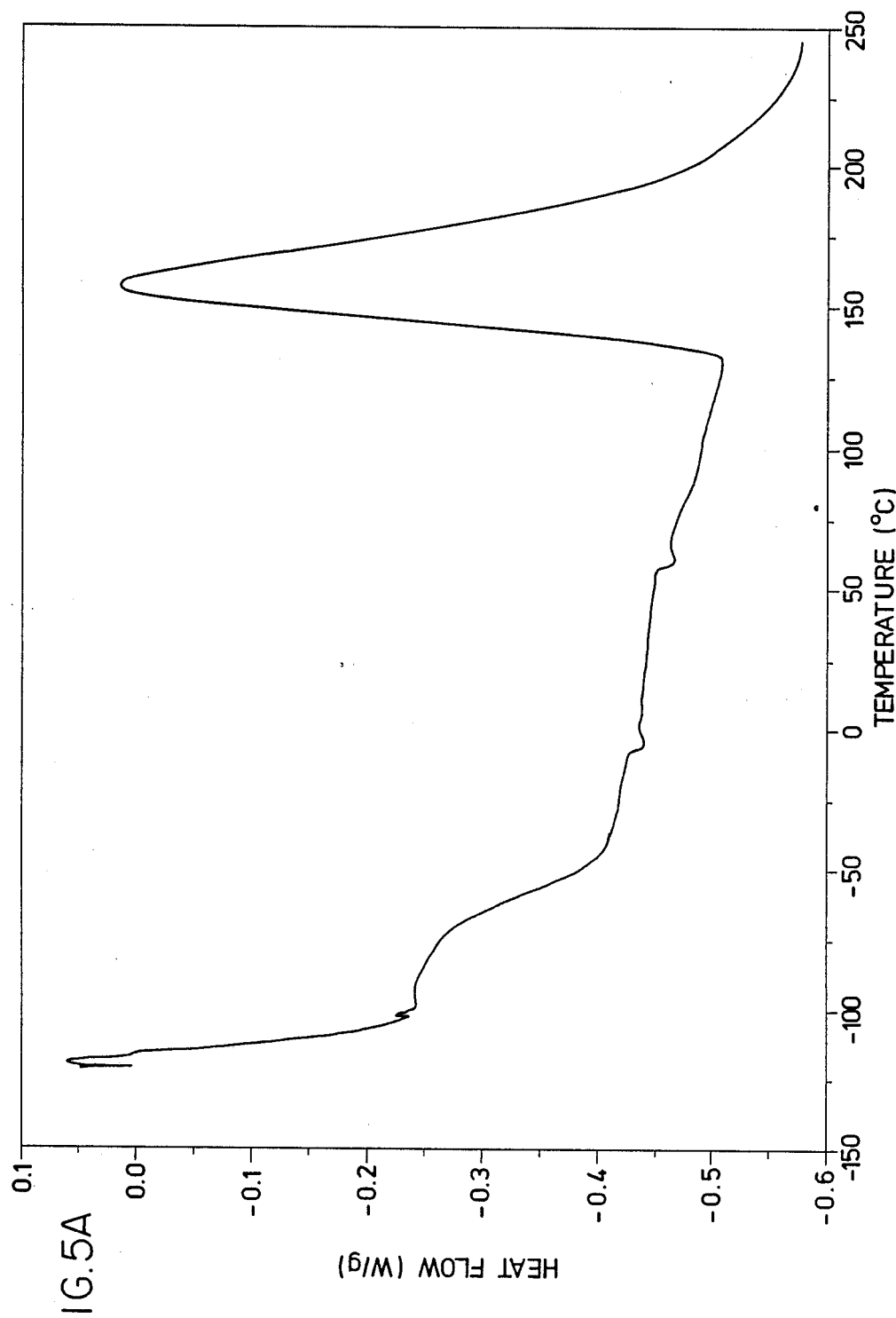
Figure 5B:
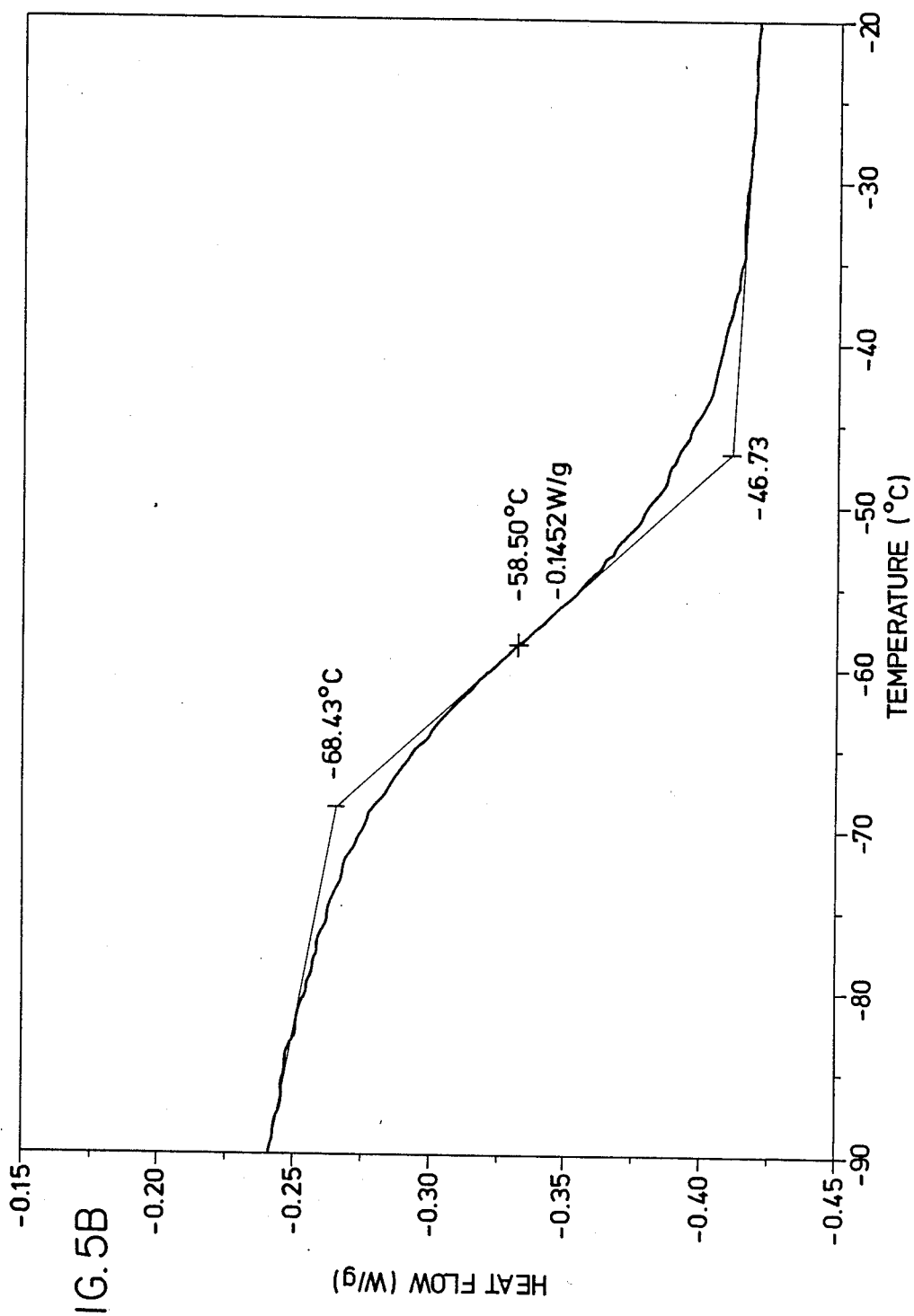
Figure 5C:
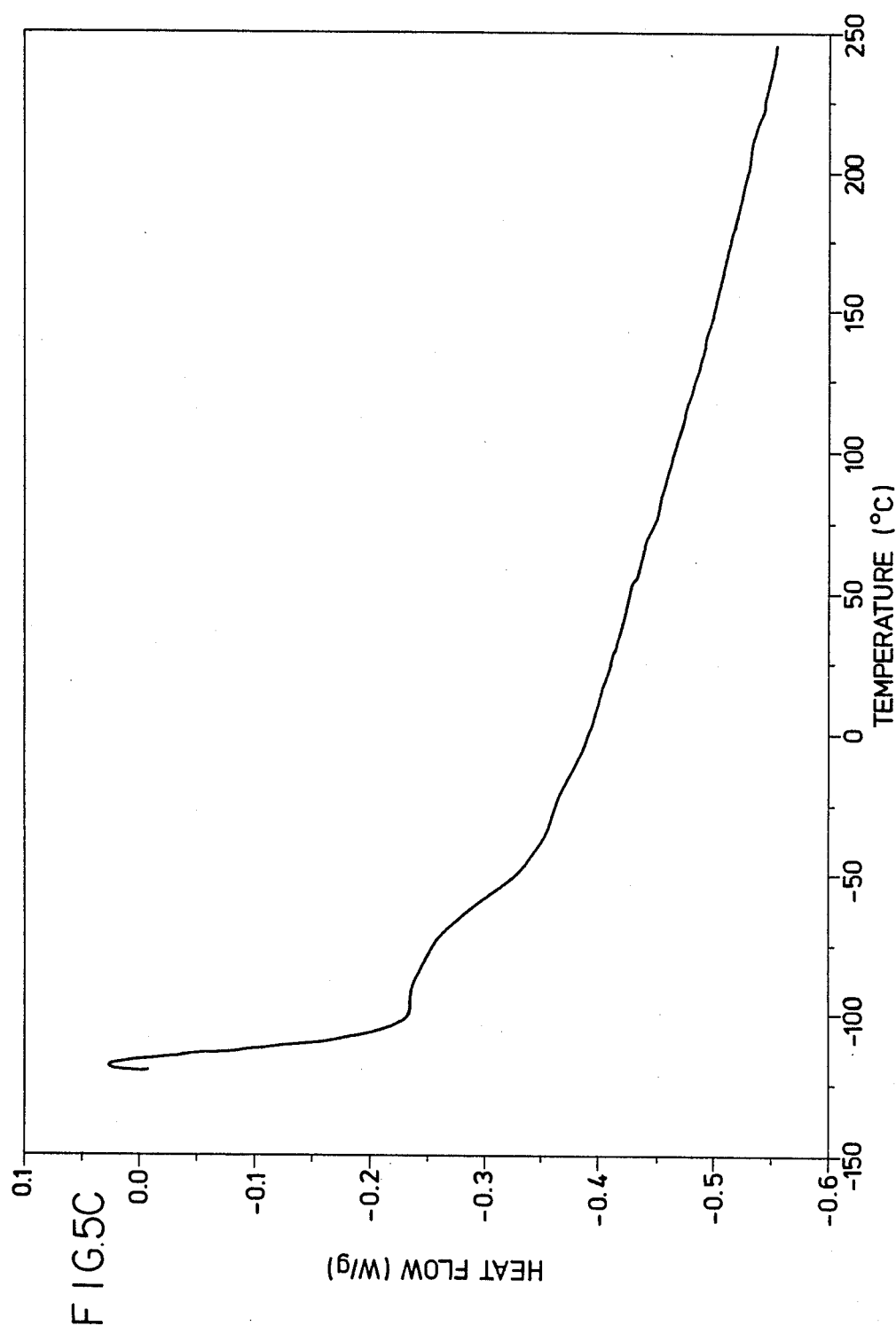

The DSC thermograms did not record any significant change of the glass transition temperature of the microgel core. The initial scan (FIG. 5A), after electronic analysis (FIG. 5B), placed the glass transition at −68.43° C. After thermal polymerization of the monomer, confirmed by the absence of an exotherm during the second scan (FIG. 5C), the glass transition of the core was recorded at −69.94° C. (FIG. 5D).

Based on the thermograms and the appearance of the photosensitive element, it was concluded that the TMPEOTA monomer partitioned to the shell. This assignment was further proven by the development rate of the respective photopolymers, as shown in Example 6 below. Monomers which partitioned in the shell increased the development rate.

EXAMPLE 6

Development Rate of Core Versus Shell Partitioning of Monomer

Photosensitive elements containing 25% HMDA or 25% TMPEOTA and microgel C were prepared and evaluated as described in Example 2.

The development rate of the TMPEOTA-containing photosensitive element (15.8 mil/min) was significantly higher than that of the equivalent HMDA-containing photosensitive element (12.4 mil/min).

This enhanced development rate was attributed to the partitioning of the TMPEOTA monomer in the shell of core/shell microgel C. It is believed that monomers which partition in the aqueous processible shell plasticize it and thus enhance the development rate. HMDA, on the other hand, which partitioned in the core as demonstrated by the DSC studies of Example 4 above, had a lower development rate. Additional results are presented in Table 7 below.

TABLE 7

| Monomer | HMDA | TMPEOTA |
|---|---|---|
| Raw Plate | | |
| Appearance | Uniform | Uniform |
| Thickness (mil) | 117 | 117 |
| Durometer (Shore A) | 22 | 16 |
| Resilience (%) | 29 | 17 |
| Imaging | | |
| Millijoules | 1465 | 1489 |
| Durometer (Shore A) | 84 | 90 |
| Resilience (%) | 20 | 23 |
| Development | | |
| Durometer (Shore A) | 85 | 89 |
| Resilience (%) | 21 | 22 |
| Relief (mil) | 62 | 79 |
| Dev. Rate (mil/min) | 12.4 | 15.8 |

EXAMPLE 7

A. Melt Rheology of Microgel C and Comparative Microgels 1A, 1D and 1E

In order for a photopolymer to be extruded well, it must have a sufficiently low melt viscosity at the shear rates involved. If the melt viscosity is very high, the pressure required to extrude the material will also be very high. This can lead to the build-up of excessive heat in the system which may result in thermal polymerization of the monomer. By examining melt rheology curves relating melt viscosity to shear rate for the different microgels, it is possible to determine the relative ease of extrusion of photopolymers containing these microgels.

Melt rheology was recorded at 150° C. using the "Monsanto Processability Tester". The series of polymers tested included microgel C (Example 1) and comparative microgels 1A, 1D and 1E.

All four microgels were shear thinning, i.e., non-Newtonian.

FIG. 6 is a graph of log of Apparent Viscosity (in poise) versus log "Shear Rate" (in 1/sec). It was found that the additional crosslinking in comparative microgel 1D increased the melt viscosity at high shear rates. Comparative microgels 1A and 1E had higher melt viscosities. In particular, the comparative microgel 1E in the series tested had an even higher viscosity at higher shear rates. Thus, Microgel C described in Example 1, would be easiest to extrude because it had a lower melt viscosity, as shown by the results in FIG. 6.

B. Melt Rheology of Microgel A. Microgel C, and Comparative Microgels 1F and 1G.

Melt rheology was recorded at 150° C. using the "Monsanto Processability Tester". The series of photopolymers tested included microgels A and C, and comparative microgels 1F and 1G.

All four microgels were shear thinning, i.e., non-Newtonian. These microgels had the following architectures:

TABLE 8

|  | Core | Crosslinking in Core (%) | Non-Crosslinked Shell |
|---|---|---|---|
| Microgel C | Elastomeric | 1% | Elastomeric |
| Microgel A | Elastomeric | 0.5% | Thermoplastic |
| Comparative Microgel 1F | Thermoplastic | 1% | Elastomeric |
| Comparative Microgel 1G | Thermoplastic | 1% | Thermoplastic |

FIG. 7 is a graph of log apparent viscosity (in poise) versus log shear rate (in 1/sec). It was found that microgel C had the lowest shear rate. At high shear rates, microgel C and comparative microgel 1F had lower viscosities than microgel A and comparative microgel 1F which had thermoplastic non-crosslinked shells. Of all the microgels evaluated, Microgel C had the lowest shear rate.

COMPARATIVE EXAMPLE 8

This example shows the advantage of using a microgel as opposed to a linear copolymer. Three linear copolymers were made and identified as Comparative Polymers 8A, 8B and 8C. Comparative polymer 8A corresponded to core C only and the other copolymer corresponded to Shell C only. Crosslinked core C contained 98% 2-ethylhexyl acrylate, 1% 1,4-butanediol diacrylate and 1% allyl methacrylate.

Comparative polymer 8B contained 80% n-butyl acrylate and 20% methacrylic acid. Comparative copolymer 8C contained 93.3% n-butyl acrylate and 6.7% methacrylic acid. This comparative polymer had the same amount of acid substitution as was present in the core shell microgel synthesized in Example 1.

Synthesis of Comparative Polymer 8A

The flask was charged with 2627 gm of deionized water and 41.25 gm of a 30% aqueous solution of sodium lauryl sulfonate. The contents of the reaction flask were heated to 80° C. under a nitrogen atmosphere. At that temperature 12.5% of a monomer mixture consisting of 1504 gm of 2-ethyl hexyl acrylate, 15.4 gm of allyl methacrylate and 15.4 gm of 1,4-butanediol diacrylate was added in one shot. This was followed immediately by the addition of 21 ml of a 7% aqueous solution of sodium phosphate and 22 ml of a 5% aqueous solution of ammonium persulfate. The reaction mixture turned milky and exothermed to 84° C. The remainder of the monomer mixture was added over a period of 90 minutes while maintaining the temperature between 82°.C. and 85° C. When the addition was finished, the reaction mixture was heated for an additional 2.5 hours at 80°–85° C. The bluish milky emulsion had a solids content of 35.8% and a particle size of 0.088 microns. The solid microgel was isolated by freeze drying.

Synthesis of Comparative Polymer 8B

The flask was charged with 2388 gm of deionized water, 37.5 gm of a 30% aqueous solution of sodium lauryl sulfonate, and 2.9 gm of ammonium persulfate. The reaction mixture was heated to 80° C. under a nitrogen atmosphere. At that temperature, a mixture of 1116 gm of butyl acrylate and 279 gm of methacrylic acid was added over a 90 minute period. The reaction mixture turned milky within 10 minutes, exothermed to 85° C. and remained at that temperature without any external heating for the duration of the monomer addition. When the addition was finished, the eaction mixture was heated at 83°–86° C. for an additional 2.5 hours. The bluish milky emulsion had a solids content of 36.1%, a particle size of 0.051 microns, and an acid number of 138. The solid polymer was isolated by freeze drying.

Synthesis of Comparative Polymer 8C

The flask was charged with 2388 gm of deionized water, 37.5 gm of a 30% aqueous solution of sodium lauryl sulfonate, and 2.9 gm of ammonium persulfate. The reaction mixture was heated to 80° C. under a nitrogen atmosphere. At that temperature, a mixture of 1302 gm of butyl acrylate and 93.5 gm of methacrylic acid was added over a 90 minute period. The reaction mixture turned milky within 15 minutes and exothermed to 85° C. It remained at that temperature throughout the addition with only minimal external heating. When the addition was finished, the reaction mixture was heated at 82°–84° C. for an additional 2.5 hours. The bluish milky emulsion had a solids content of 36.3%, a particle size of 0.054 microns, and an acid number of 48.7. The solid polymer was isolated by freeze drying.

The resin evaluation of these polymers is presented in Table 9. Microgel C, discussed in Example 1, was the control against which these polymers were evaluated.

TABLE 9

|  | Microgel C | Comparative Polymers | | |
| --- | --- | --- | --- | --- |
|  |  | 8A | 8B | 8C |
| Objective | Control | Core Only | Shell Only | 1 |
| Tg (DSC) °C. |  |  |  |  |
| Scan #1 | −65.61 | −63.24 | 2 | 2 |
| Scan #2 | −67.04 | −62.18 | −13.82 | −35.81 |
| Solubility |  |  |  |  |
| 1% Na$_2$CO$_3$H$_2$O | Dispersion | Not Tested | Sl.Hazy Sol. | V.Sl.Swelling[3] |
| Resin Plate |  |  |  |  |
| Flow (150° C.) | Good | Good[4] | Good[4] | Good[4] |
| Appearance | Transparent | Transparent | Transparent | Transparent |
| Thickness (mil) | 118 | 123 | 112 | 150 |
| Durometer (A) | 50 | 2 | 54 | 0 |
| Resilience (%) | 9 | 3 | 10 | (0)[5] |

[1]Copolymer with acid substitution equal to acid substitution of microgel C.
[2]Tg(s) of copolymer is (are) assigned after second scan.
[3]Clear supernatant; only very slight haze after acidification with 10% H$_2$SO$_4$
[4]Pressed at 100° C.; excessive flow at 150° C.
[5]Polymer too tacky; resiliometer probe stuck.

Photopolymers containing comparative polymers 8A, 8B and 8C were synthesized following the procedure detailed in Example 2. The photopolymer evaluation is presented in Table 10. In addition, a fourth photopolymer was made by blending comparative polymer 8A with comparative polymer 8B so that they were present in a ratio of 2:1. This 2:1 ratio corresponded to the core to shell ratio of microgel C which was synthesized in Example 1.

TABLE 10

|  | Microgel C | Photopolymer Containing Comparative Polymer | | |
| --- | --- | --- | --- | --- |
|  |  | 8A | 8B | 8A + 8B[1] |
| Raw Plate |  |  |  |  |
| Appearance | Uniform | Uniform | Uniform | Uniform |
| Thickness (mil) | 124 | 128 | 141 | 128 |
| Durometer (A) | 9 | 10 | 2 | 0 |
| Resilience (%) | 21 | 3 | 4 | 4 |
| Imaging |  |  |  |  |
| Millijoules | 1582 | 1577 | 1588 | 1601 |
| Durometer (A) | 87 | 79 | 60 | 60 |
| Resilience (%) | 21 | 16 | 10 | 12 |
| Development |  |  |  |  |
| Durometer (A) | 87 | 85 | 64 | 64[2] |
| Resilience (%) | 21 | 16 | 8 | 11[2] |
| Relief (Mil) | 83 | 25.5 | 0 | 57[2] |
| Dev.Rate (Mil/Min) | 16.6 | 5.1 | 0 | 11.4[2] |

[1]Blend of Comparative Polymer 8A and 8B in a 2:1 ratio corresponding to the 2:1 core/shell ratio of microgel C.
[2]Approximate data due to uneven surface.

What is claimed is:

1. An aqueous processible solid photosensitive composition for relief printing plates comprising
   (a) an addition photopolymerizable ethylenically unsaturated monomer;
   (b) a photoinitiator or photoinitiating system activated by actinic light; and
   (c) a core shell microgel binder; wherein the core shell microgel binder has two domains, a core having less than 10% crosslinking and an aqueous processible non-crosslinked outer shell consisting of an acid-modified copolymer, and further wherein the monomer partitions in the shell of the microgel.

2. The composition according to claim 1 wherein the core is elastomeric and the shell is elastomeric.

3. The composition of claim 1 wherein the weight ratio of the core to the shell is from about 4:1 to about 1:4.

4. The composition of claim 1 which has a creep viscosity of at least 50 megapoise.

5. The composition of claim 1 which has a plasticizer.

6. The composition of claim 1 wherein the acid modified copolymer is a methacrylic acid modified n-butyl acrylate.

7. The composition of claim 1 wherein the microgel swells at least 10% in at least one of the following solvents: n-heptane, carbon tetrachloride, toluene, methylene chloride, ethyl acetate, acetone, acetonitrile, acetic acid, dimethylsulfoxide, dimethylformamide, formamide, water, aqueous ammonium hydroxide solution containing up to 10% by weight ammonia, aqueous potassium hydroxide solution containing up to 10% by weight potassium hydroxide, methylene chloride-methanol solution containing by weight 92% methylene chloride and 8% methanol, and aqueous carbonate solution containing by weight 1% sodium carbonate.

8. The composition of claim 7 which swells at least 50% in at least one of the solvents.

9. The composition of claim 1 wherein the binder is a blend of a core shell microgel and a preformed macromolecular polymer.

10. A process for preparing a flexographic printing relief comprising:
   (a) imagewise-exposing a photosensitive composition to actinic radiation;
   (b) removing the unexposed areas; and
   (c) applying post development treatment; characterized in that a photosensitive composition of claim 1 or claim 9 is used.

11. An aqueous processible flexographic printing element which comprises a support; a layer of a photosensitive composition, said composition comprising
   (a) an addition photopolymerizable ethylenically unsaturated monomer;
   (b) a photoinitiator or photoinitiating system activated by actinic light; and
   (c) a core shell microgel binder wherein the core shell microgel binder has two domains, a core having less than 10% crosslinking and an aqueous processible non-crosslinked outer shell consisting of an acid-modified copolymer, and further wherein the monomer partitions in the shell of the microgel; and a flexible cover sheet.

* * * * *